(12) United States Patent
Tu et al.

(10) Patent No.: US 7,664,203 B2
(45) Date of Patent: Feb. 16, 2010

(54) SIMULTANEOUS TUNING OF MULTIPLE CHANNELS USING INTERMEDIATE FREQUENCY SUB-SAMPLING

(75) Inventors: Dan Q. Tu, San Diego, CA (US); Louis F. Coffin, III, Mountain View, CA (US)

(73) Assignee: Microsoft Corporation, Redmond, WA (US)

( * ) Notice: Subject to any disclaimer, the term of this patent is extended or adjusted under 35 U.S.C. 154(b) by 417 days.

(21) Appl. No.: 11/058,076

(22) Filed: Feb. 14, 2005

(65) Prior Publication Data

US 2005/0144650 A1 Jun. 30, 2005

Related U.S. Application Data

(63) Continuation of application No. 09/892,124, filed on Jun. 26, 2001, now Pat. No. 6,888,888.

(51) Int. Cl.
H03K 9/00 (2006.01)
(52) U.S. Cl. .................. 375/316; 375/243; 375/254; 375/261; 375/268; 375/270; 375/271; 375/277; 375/278; 375/284; 375/285
(58) Field of Classification Search .................. 375/316, 375/234, 254, 261, 270, 285
See application file for complete search history.

(56) References Cited

U.S. PATENT DOCUMENTS

| | | | | |
|---|---|---|---|---|
| 5,428,836 A | * | 6/1995 | Sanecki et al. | ............... 455/315 |
| 5,722,053 A | * | 2/1998 | Kornfeld et al. | ............... 455/86 |
| 5,852,630 A | * | 12/1998 | Langberg et al. | ............ 375/219 |
| 5,956,373 A | | 9/1999 | Goldston | |
| 5,959,592 A | | 9/1999 | Petruzzelli | |
| 6,072,996 A | * | 6/2000 | Smith | ....................... 455/189.1 |
| 6,265,949 B1 | * | 7/2001 | Oh | .............................. 332/103 |
| 6,498,929 B1 | | 12/2002 | Tsurumi | |
| 6,507,627 B1 | * | 1/2003 | Imura | ......................... 375/332 |
| 6,556,639 B1 | | 4/2003 | Goldston et al. | |
| 6,728,467 B2 | | 4/2004 | Oshima | |
| 6,885,695 B1 | * | 4/2005 | Coniglione | .................. 375/147 |
| 6,922,449 B1 | * | 7/2005 | Bristow | ...................... 375/316 |
| 2002/0012407 A1 | * | 1/2002 | Sakurai | ...................... 375/327 |

OTHER PUBLICATIONS

Notice of Allowance dated Jan. 13, 2005 cited in related U.S. Appl. No. 09/892,124.

* cited by examiner

*Primary Examiner*—Shuwang Liu
*Assistant Examiner*—Kabir A Timory
(74) *Attorney, Agent, or Firm*—Workman Nydegger

(57) ABSTRACT

Methods and systems for processing a single sub-channel that includes two or more combined channels. Using intermediate frequency sub-sampling, two or more channels from a broad band signal are combined into a single sub-channel for further analog and digital processing. Each of the two or more channels is down converted to an intermediate frequency, filtered to remove certain undesired channels, and combined such that the two or more channels are adjacent to each other. A digital representation of the sub-channel is produced from the combined intermediate frequency channels. Each channel within the digital representation is down converted to baseband, and the in-phase and quadrature components are separated from each other. Compared to one direct down conversion technique, intermediate frequency sub-sampling as described in the application may reduce the number of analog to digital converters and control amplifiers used in analog processing by a factor of four.

20 Claims, 14 Drawing Sheets

| Analog Component/Function (8 Independent and Simultaneous Tuners) | Unit Required for IF Sub-sampling (Figs 4A & 4B) | Unit Required for Direct Down Conversion (Figs 3A & 3B) |
|---|---|---|
| RF Switch | 1 (412) | 1 (312) |
| Low Noise Amp (WB) | 1 (416) | 1 (316) |
| XO | 1 (426) | 1 (326) |
| Frequency Synthesizer | 8 (428) | 8 (328) |
| BPF (WB) | 1 (422) | 1 (322) |
| Mixer | 8 (432) | 16 (332) |
| Variable (3db Cutoff Freq) LPF | 4 (438) | 0 |
| Variable (3db Cutoff Freq) HPF | 4 (435) | 0 |
| Variable (3db BW) BPF | 4 (439) | 0 |
| Summer | 4 (437) | 0 |
| Control Amplifier | 4 (436) | 16 (336) |
| 90 Degree Phase Splitter | 0 | 8 (344) |
| Analog to Digital Converter | 4 (442) | 16 (342) |
|  |  |  |
| Additional Digital Component/Function |  |  |
| Multiplier | 16 (449) | N/A |
| NCO (Sin/Cos) | 8 (445) | N/A |
|  |  |  |
|  |  |  |

SIMULTANEOUS TUNING OF MULTIPLE CHANNELS USING INTERMEDIATE FREQUENCY SUB-SAMPLING

CROSS-REFERENCE TO RELATED APPLICATIONS

The present application is a continuation application of commonly-assigned U.S. patent application Ser. No. 09/892,124 filed Jun. 26, 2001, entitled "Simultaneous Tuning of Multiple Channels Using Intermediate Frequency Sub-Sampling", and which is incorporated herein by reference.

BACKGROUND OF THE INVENTION

1. The Field of the Invention

The present invention relates to signal processing. More specifically, the present invention relates to methods and systems for combining two or more channels of a received signal into one sub-channel so that certain signal processing may be performed on the sub-channel with fewer components than would be required to process the two or more channels separately.

2. Background and Related Art

Initially, satellite television systems included a single dish and a single receiver. With a single receiver, viewers had access to the large number of channels carried by a single satellite signal, but were able to view or record only one channel at any given time. Viewing different channels on separate televisions, recording one program while watching another, simultaneously recording two different programs, and using features like picture-in-picture were not possible. To complicate matters, the number of channels available to viewers and the average number of televisions served by a single satellite system have increased over time. Some satellite television systems are capable of simultaneously receiving signals from multiple satellites.

To solve these problems, satellite television service providers began offering multiple receivers to enhance the value of the service they provide. FIG. 1 illustrates one prior art system that includes multiple receivers. With multiple receivers, it is possible to view different channels on separate televisions, record one program while watching another, simultaneously record two different programs, use picture-in-picture, and the like. These options have been available for some time in the context of publicly broadcasted television programming because, as a general rule, separate tuners are implemented in each individual television and video cassette recorder ("VCR"). For picture-in-picture, a single television may include multiple tuners. As a result, consumers have grown to expect the foregoing features, without necessarily appreciating the need for or use of multiple tuners. Moreover, the market for televisions, VCRs, and the like, is such that broadcasters using public airwaves need not subsidize manufactures as a means of increasing market penetration.

In the prior art system of FIG. 1, multiple channels may be received over inputs 102. Input 102A and input 102B are used to indicate that channels may be provided by separate sources. Multiple receivers 112 tune channels for various devices 122. For example, receivers 112A and 112B tune different channels for display devices 122A and 122B. Note that receiver 112B is connected to both input 102A and input 102B, and therefore, is capable of tuning channels from separate sources. Receivers 112C and 112D tune different channels for VCRs 122C and 122D. As described above, with multiple tuners it is possible to view and/or record different channels simultaneously. Both receiver 112E and receiver 112F are connected to display 122E to provide picture-in-picture capability.

However, satellite service providers face some challenges that are relatively specific to the industry. Market considerations may make it difficult to charge more than a nominal fee for each additional receiver. Furthermore, fierce competition has lead satellite service providers to subsidize the expense of receivers to consumers, on the theory that the subsidy can be recouped over time through programming charges. As a result, providing additional receivers at a nominal price significantly prolongs the time required for satellite service providers to recover the costs associated with supplying receivers. Therefore, methods and systems, such as the system illustrated in FIG. 2 and discussed in more detail below, capable of simultaneously processing multiple channels at a relatively low cost are desired.

Turning next to FIGS. 3A-3D, the block diagrams illustrating certain portions of a system that uses direct down conversion rather than the present invention will be described. FIGS. 3A-3D and the corresponding discussion are included here to provide context for the present invention and are not an admission of prior art in any degree. The system is capable of simultaneously tuning up to eight channels. Components that are part of the processing for a particular channel are labeled with a numeric suffix, "1" for the first channel, "2" for the second channel, and so on. Those of skill in the art will recognize that the components shown in FIGS. 3A-3D do not necessarily represent individual physical components, but rather may represent collections of physical components to accomplish a particular task or goal.

Beginning with the analog processing shown in FIG. 3A, RF switch 312 receives an L-band radio frequency input signal that is approximately 1 GHz wide (from about 900 MHz to about 2200 MHz). The input signal contains multiple transponder channels that may be referred to as simply transponders or channels. Wide-band low noise amplifier ("LNA WB") 316 ensures that the received signal power level is sufficient for the processing that follows. Signals outside of the bandwidth of interest are rejected by wide-band band pass filter ("BPF WB") 322. Eight frequency synthesizers 328 use crystal oscillator 326 to generate appropriate frequencies for directly converting one or more channels to baseband.

Mixers 332 mix the frequencies supplied by frequency synthesizers 328 with the received input signal to directly convert each of the eight channels to baseband. 90-degree phase splitters 334 provide two versions of each frequency generated by frequency synthesizers 328, 90-degrees out of phase with each other, to separate the in-phase (I) and quadrature (Q) components of each channel. Frequency synthesizers 328 are tuned by synthesizer control module 306. (Of the sixteen mixers 332 and the eight phase splitters 334, only mixers 332-1A and 332-1B, and phase splitters 334-1 are shown.) Note that at this point, each of the eight channels has been divided into an I and Q component channel, for a total of sixteen component channels that undergo a significant amount of separate processing.

Each of the sixteen component channels (I and Q components for each of eight channels) is amplified by one of the amplifiers ("AMP") 336, then passes through one of the variable low pass filters ("LPF") 338, and is converted from analog to digital by one of the analog to digital converters ("A/D") 342 at a sampling frequency of Fs. The cut-off frequency for each LPF 338 is controlled through filter control module 302 to account for diverse symbol rates. (Again, of the sixteen amplifiers 336, sixteen low pass filters 338, and sixteen analog to digital converters 342, only AMPs 336-1A and 336-1B, and LPFs 338-1A and 338-1B, and A/Ds 342-1A and 342-1B are shown.) The gain for each of the amplifiers 336 is controlled by an automatic gain control signal (e.g., AGC 1,1) that establishes an appropriate signal level for the operation of analog to digital converters 342.

Analog to digital converters 342 are shown in dashed lines to indicate that the analog processing for direct down conversion may be part of the analog processing shown in FIG. 3A or part of the digital processing that is discussed with reference to FIGS. 3B-3-D. This also explains the presence of analog signals, such as AS1_I and AS1_Q, and digital signals, such as DS1_I and DS1_Q, for each channel. Typically, only one or the other is available. Those of skill in the art will recognize that significant costs and problems may occur in attempting to place sixteen amplifiers and sixteen analog to digital converters (with eight bits each for 128 lines total) in relatively close proximity, such as within a single integrated circuit. Among other things, such a large number of analog components requires substantial space to ensure proper heat dissipation and to avoid unacceptable levels of crosstalk between the individual component signals.

As described above, the analog to digital converters 342 shown in FIG. 3B may be included within the analog processing of FIG. 3A or the digital processing of FIGS. 3B-3D. Note that only the processing of the first channel is shown to simplify the drawings. Although not shown, the other seven channels are processed in a similar fashion. If signals are present for the first channel (i.e., the first channel is being tuned), switch 346 passes the I and Q signal components on for further processing. Note that automatic gain control 348 monitors the signal levels produced by analog to digital converters 342 so that the gain of amplifiers 336 may be adjusted accordingly. DC offset filter 352, with components 352-1A and 352-1B, removes DC bias from the digital representations of the I and Q components of the first channel.

FIG. 3B also shows a clock tree and several interfaces. In clock network 362, all independent clocks are synchronized. External microprocessor interface 364 provides for communication with an external microprocessor. Analog filter control interface 366 is used to control the variable analog filters through filter control module 302 (FIG. 3A), such as by altering the cut-off frequency based on symbol rate. Frequency synthesizer control interface 368 tunes the frequency synthesizers through frequency synthesizer control module 306 (FIG. 3A) to produce the signals used in directly down converting to baseband.

Because the processing 370-1 of FIG. 3C is similar to the processing of FIG. 4C, it will be described here from a relatively high-level perspective. During processing 370-1, amplitude and phase imbalance between the I and Q components of a tuned channel are removed. Because the sampling frequency accounts for a range of symbol rates, low symbol rate signals are likely to be oversampled and undergo decimation and filtering. Additional filtering accounts for power spectral shaping that may be performed by the signal transmitter. Finally, frequency and/or phase offsets that may result in constellation shifts are removed.

The processing 390-1 shown in FIG. 3D likewise will be described in somewhat greater detail with respect to FIG. 4D, below. At this stage of the processing, the channel as transmitted has been essentially recovered and what remains is to arrange and organize the channel content so that the content is in a format that can be displayed. Processing 390-1 includes a Viterbi decoder/synchronizer, a Reed-Solomon synchronizer, a convolution deinterleaver, a Reed-Solomon decoder, and a descrambler.

Note that in the tuner implementation of FIGS. 3A-3D, each tuned channel of the input signal was immediately converted to baseband and separated into its I and Q components, resulting in sixteen separate signal paths when simultaneously tuning eight separate channels. As a result, it may be difficult or impossible to implement the needed analog processing (e.g., sixteen control amplifiers and sixteen separate analog to digital converters) within a single integrated circuit due to interference between channels, heat dissipation problems, power consumption, and the like. Therefore, a receiver capable of simultaneously tuning eight channels and implemented using direct down conversion as shown in FIGS. 3A-3D, generally will be more expensive and less reliable than one implementing the present invention as described with respect to FIGS. 4A-4D.

BRIEF SUMMARY OF THE INVENTION

The present invention combines two or more channels into a sub-channel such that certain signal processing may be performed on the combined sub-channel rather than on the two or more channels separately. An input signal includes a plurality of available channels that may contain any type of data, such as video, audio, electronic program guides, control signals, electronic publications, software, scripts, Internet content, etc. In a satellite environment, the input signal may have channels for any of one or more received transponder signals.

A first channel from the input signal is down converted to a first, relatively lower, intermediate frequency. Typically, other channels contained within the input signal are down converted as well, with the position of one channel relative to another being maintained. Signals above the first channel then are removed, leaving the first channel and any channels below the first channel. Similarly, a second channel from the input signal is down converted to a second, relatively higher, intermediate frequency. Here too, channels other than the second channel that are contained within the input signal may be down converted as well, with the relative positions of channels being maintained. Signals below the second channel then are removed, leaving the second channel and any channels above the second channel.

Next, the first and second intermediate frequency signals are combined, the first and second intermediate frequencies having been selected so that the first channel and the second channel are now adjacent to each other, regardless of their relative positions in the input signal. Because the first intermediate frequency may include signals that are below the first channel and the second intermediate frequency may include signals above the second channel, signals below the first channel and above the second channel are removed from the combined first and second intermediate frequency signal. At this point, the first and second channels have been combined into a sub-channel.

Now, further processing may be performed on the sub-channel, rather than on the first and second channels separately. For example, the sub-channel may be amplified and converted to a digital representation. In contrast, other techniques may divide a single channel into two components. Using these other techniques, two channels become four, whereas using the present invention, the two channels become one. By comparison, these other techniques require as many as four amplifiers and four analog to digital converters for every amplifier and analog to digital converter used when practicing the present invention. Using fewer analog components improves heat dissipation, reliability, and use of space, while reducing cost and power consumption. As a result, the present invention greatly facilitates a single integrated circuit implementation for the analog processing needed in simultaneously tuning multiple channels contained within a received input signal. Thus, the present invention also facilitates the development of a single receiver capable of simultaneously tuning multiple channels, thereby meeting consumer demands, at an appropriate cost.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered as limiting its scope, the invention will be described and explained with additional specificity and detail through the use of the accompanying drawings in which:

FIG. 6 is a list comparing the components used in one embodiment of the present invention with another technique.

DETAILED DESCRIPTION OF THE PREFERRED EMBODIMENTS

The present invention extends to both methods and systems for combining two or more channels into a sub-channel such that certain signal processing may be performed on the combined sub-channel rather than on the two or more channels separately. By combining two or more channels into a sub-channel, the present invention allows the analog processing, useful in simultaneously tuning multiple channels of a received input signal, to be implemented within a single integrated circuit, thereby enabling the development of a single receiver capable of simultaneously tuning multiple channels at an appropriate cost. The embodiments of the present invention may comprise a special purpose or general purpose computer including various computer hardware.

Figure 1:
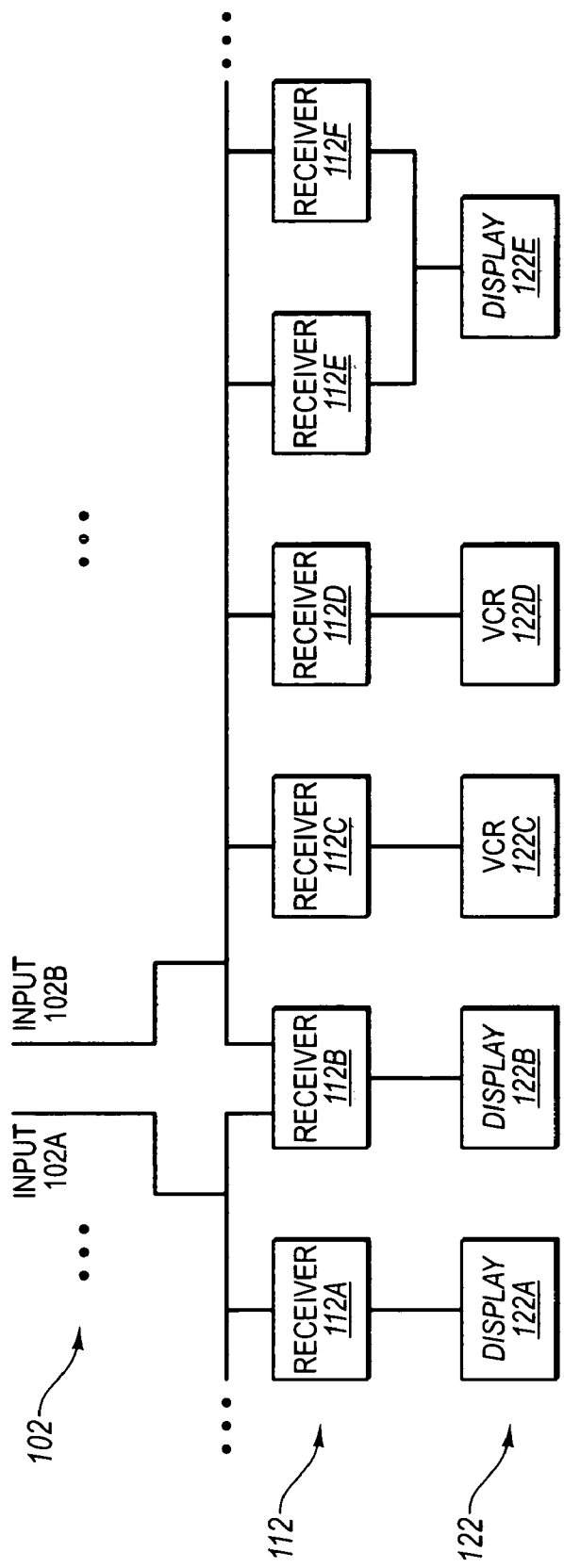
FIG. 1 is a high-level block diagram of a prior art system for simultaneously tuning multiple channels.
Figure 2:
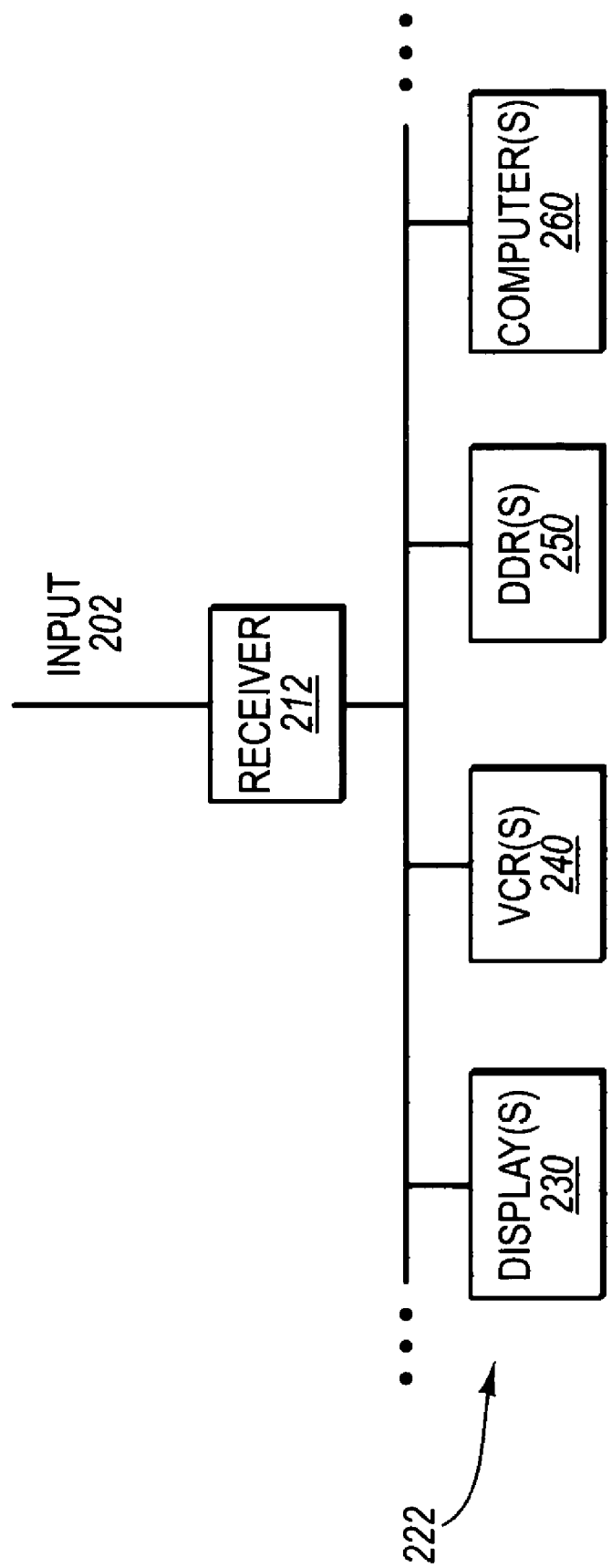
FIG. 2 illustrates an exemplary system that practices the present invention.

FIG. 2 illustrates a high level block diagram of an exemplary system that provides a suitable environment for practicing the present invention. A single receiver 212 is connected to an input 202 that provides multiple channels. Receiver 212 is capable of simultaneously tuning multiple channels for various devices 222. Devices 222 may be any type of devices, including one or more displays 230, one or more video cassette recorders (VCRs) 240, one or more digital data recorders (DDRs) 250, and one or more computers 260. Of course, the present invention is in no way limited by the diagram shown in FIG. 2, and may be practiced in a wide range of environments. An exemplary implementation of a tuner, according to the present invention, for receiver 212 will be described below with respect to FIGS. 4A-4D.

Embodiments within the scope of the present invention also may include computer-readable media for carrying or having computer-executable instructions or data structures stored thereon. Such computer-readable media can be any available media that can be accessed by a general purpose or special purpose computer. By way of example, and not limitation, such computer-readable media may comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media. Computer-executable instructions comprise, for example, instructions and data which cause a general purpose computer, special purpose computer, or special purpose processing device to perform a certain function or group of functions.

With an understanding of other technology useful in simultaneously tuning multiple channels, such as that illustrated in FIGS. 3A-3D and discussed above, the present invention can be more fully appreciated. The embodiment of the present invention shown in FIGS. 4A-4D will be described in detail following a brief overview of intermediate frequency sub-sampling. As with FIGS. 3A-3D, those of skill in the art will recognize that the components shown in FIGS. 4A-4D do not necessarily represent individual physical components, but rather may represent collections of physical components to accomplish a particular task or goal.

In intermediate frequency sub-sampling, analog to digital ("A/D") conversion is performed on an analog carrier signal at an intermediate frequency rather than at baseband. The AID sampling produces a replica of the intermediate frequency modulated carrier signal with images positioned at (IFc+/−N*Fs), where IFc is the center frequency of the desired signal spectrum, N=1, 2, 3, ..., and Fs is the sampling frequency of the A/D. Preferably, and in accordance with the present invention where two arbitrary channels are down converted to intermediate frequencies IF1 and IF2, and combined such that the intermediate frequency channels are adjacent to each other, IFc=(IF1+IF2)/2. More generally, IFc is considerably higher than either Fs or the maximum frequency component of the desired signal. In order to satisfy the Nyquist criteria, Fs should be at least twice the maximum frequency of the desired signal to prevent spectral aliasing. The desired signal image closest to DC is digitally mixed down to baseband for digital demodulation and decoding.

Figure 4A:
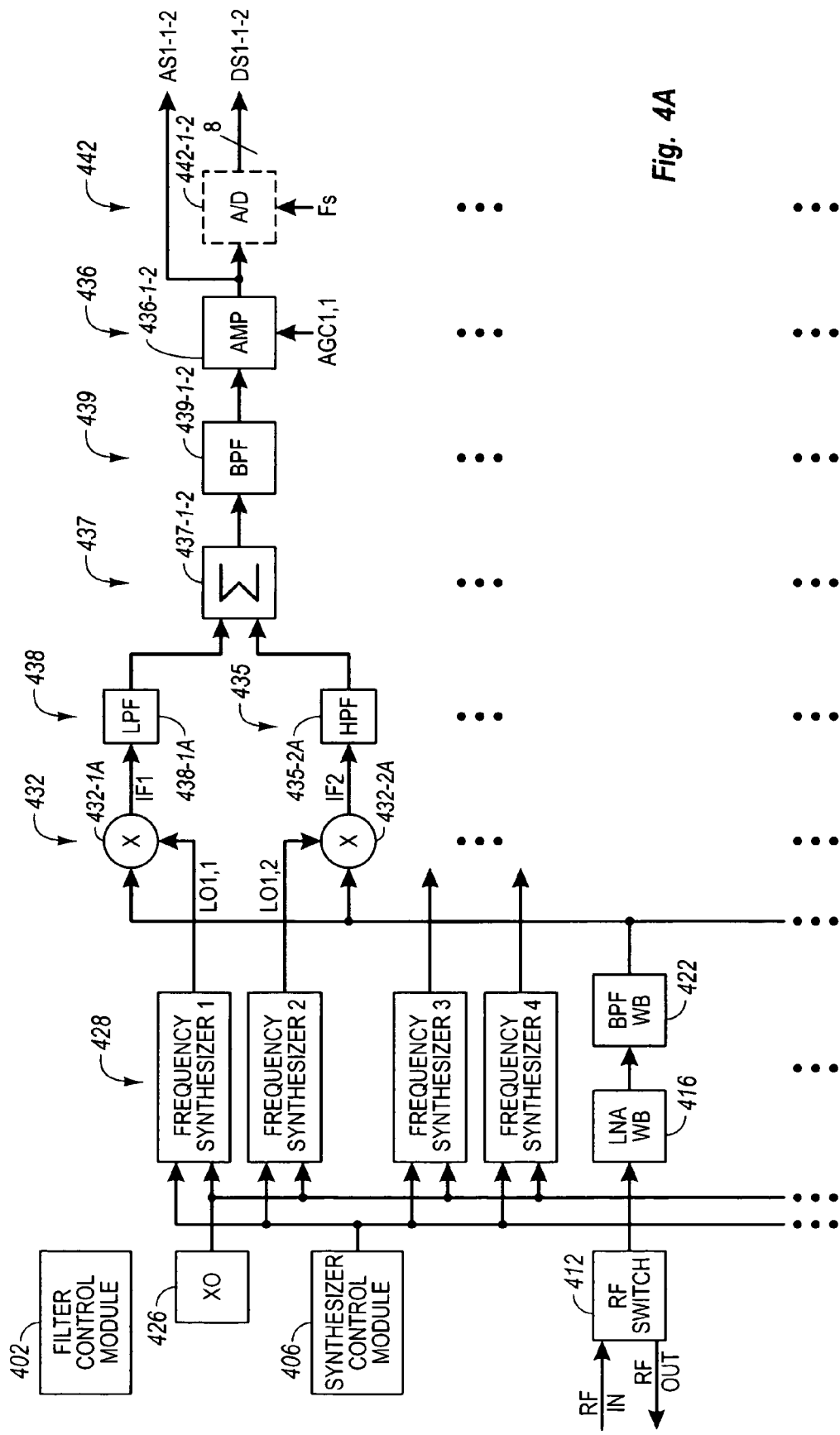
FIGS. 4A-4D are block diagrams illustrating certain portions of one embodiment of the present invention.
Figure 4B:
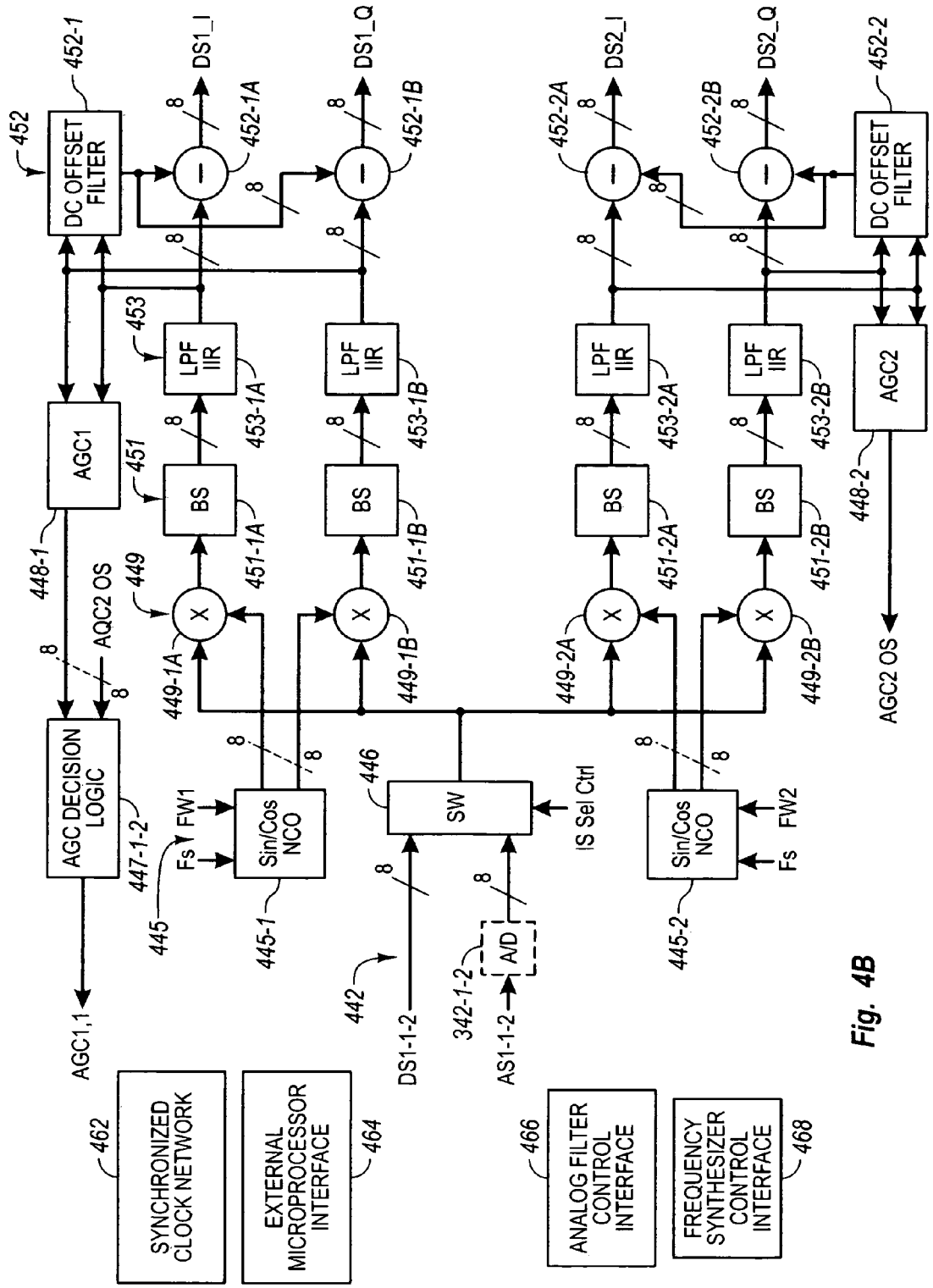
Figure 4C:
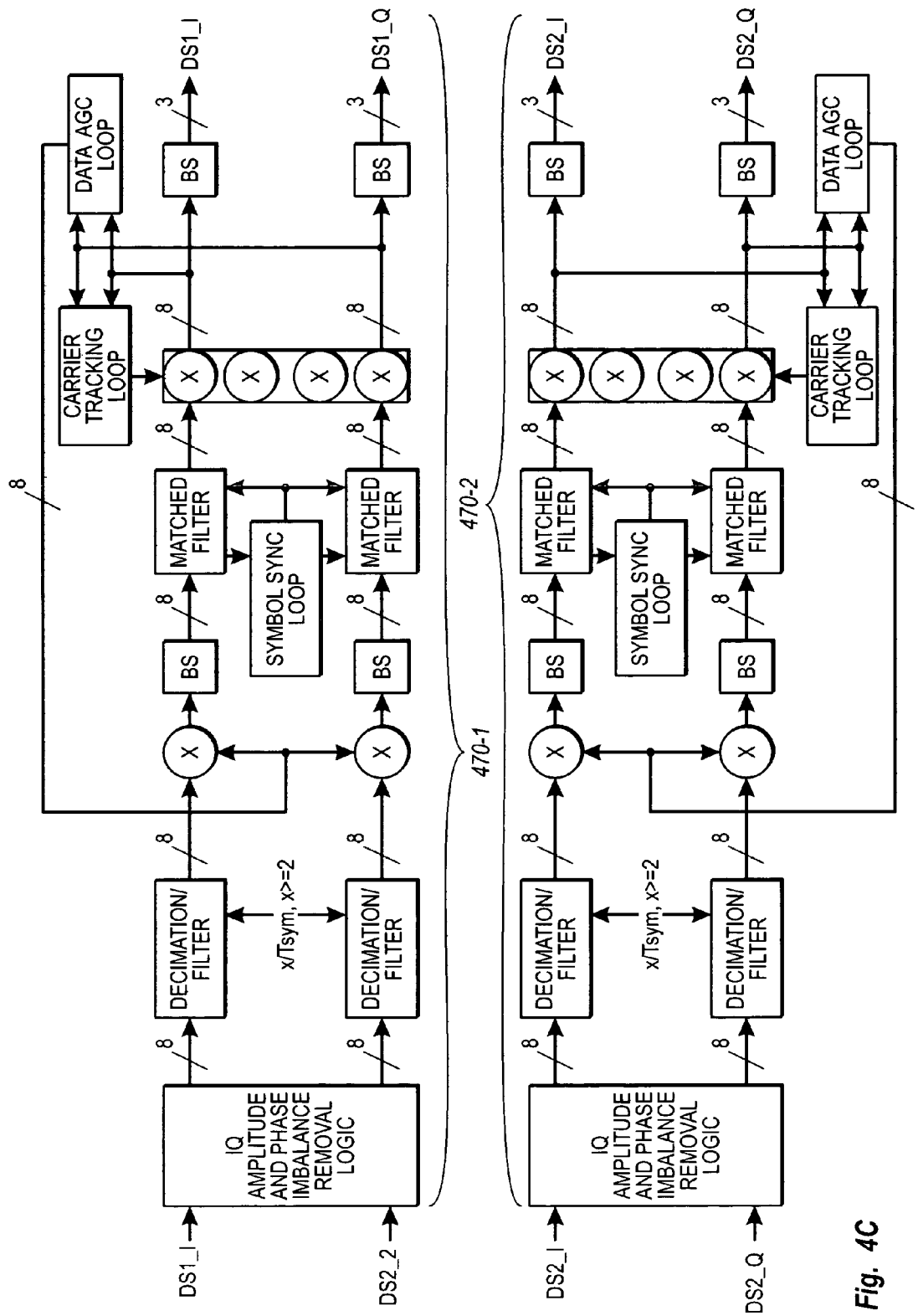
Figure 4D:
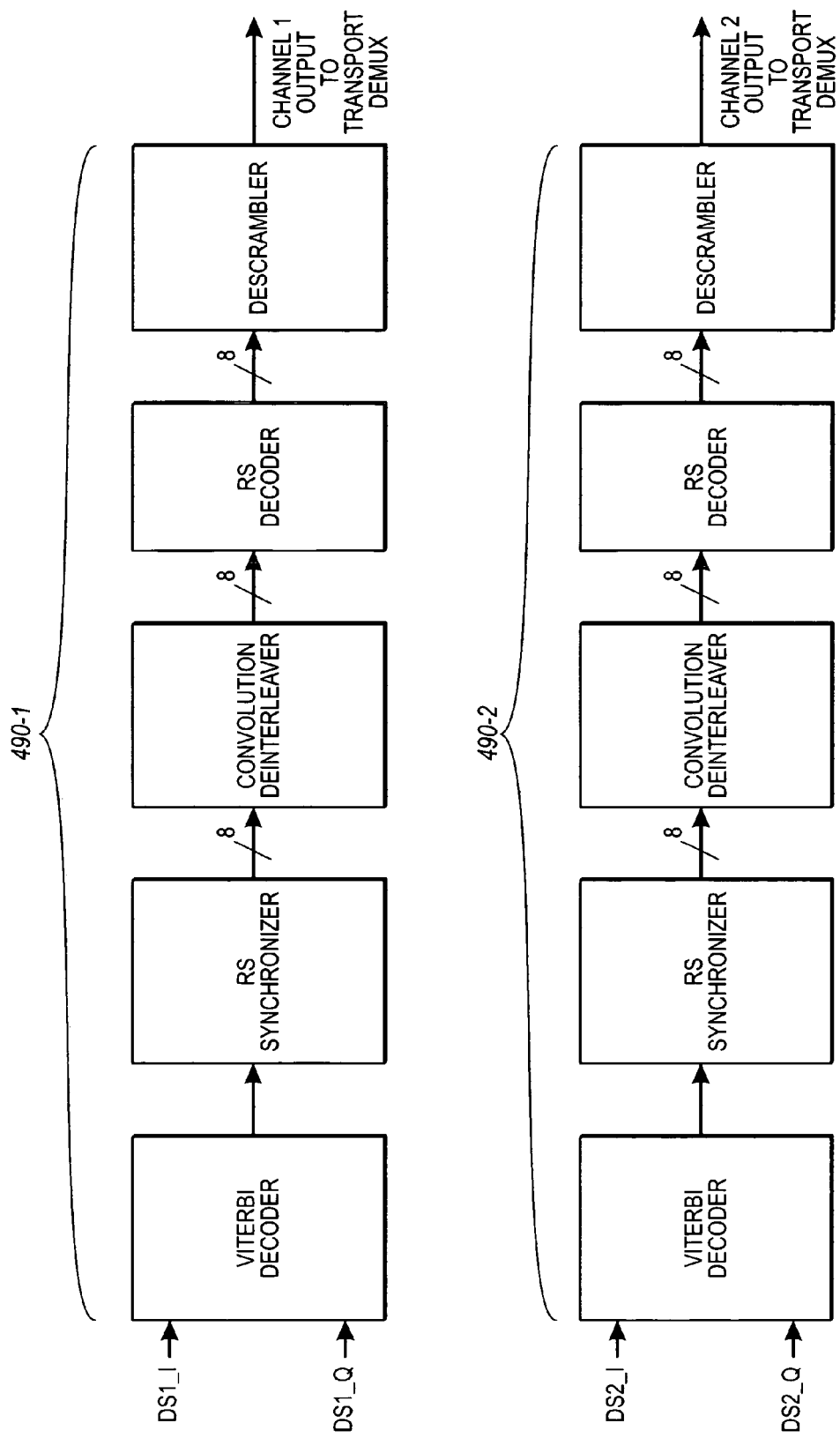

FIGS. 4A-4D are block diagrams illustrating certain portions of one embodiment of the present invention that is capable of simultaneously tuning eight channels. The embodiment shown in FIGS. 4A-4D is implemented as two ASICs, one performing the bulk of the analog processing as shown in FIG. 4A, and the other performing mostly digital processing as shown in FIGS. 4B-4D. (The analog ASIC and digital ASICs correspond to portions of the receiver 212 of FIG. 2.) The frequency spectra shown in FIGS. 5A-5H will be discussed together with FIG. 4A to illustrate the processing performed on an exemplary input signal. Nevertheless, those of skill in the art will recognize that combining multiple independent channels into a sub-channel has wide variety of applications and therefore the present invention is in no way limited to the specific embodiment described below.

Figure 5A:
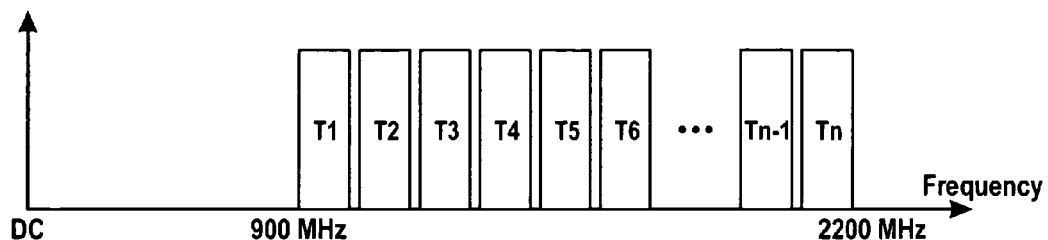
FIGS. 5A to 5H show the channels present in a signal at various stages of processing according to the present invention.

RF switch 412 receives an input signal, such as the one shown in FIG. 5A, that contains a plurality of channels or transponders, labeled T1-Tn. As used in this application, the term "channel" should be interpreted broadly to encompass any particular bandwidth of interest, independent of whether or not data within the bandwidth is related. For example, channel accurately describes the bandwidth used to broadcast a single television program. Likewise, channel accurately describes a bandwidth that includes the broadcast signal from two or more television programs that have been combined in accordance with the present invention. Further, a channel may contain any type of data or content. At times, a combined channel may be referred to as a channel pair to emphasize that the bandwidth includes two or more separate and unrelated data streams. Therefore, regardless of the number of independent, separate, and/or unrelated data streams within any arbitrary bandwidth, the term channel may be used to reference the bandwidth.

The input signal may be received from any of several sources, including a satellite system that receives broadcast signals from one or more satellites. One exemplary system receives signals from three separate satellites, with the signal from each satellite containing 32 channels or transponders. Like the term channel, "transponder" should be interpreted broadly to encompass any particular bandwidth of interest. In some circumstances, transponder may refer to the entire bandwidth transmitted by a satellite, whereas in other circumstances, transponder is a reference to a particular data stream within a larger overall bandwidth. Based at least in part on viewer input, the satellite system selects a plurality of the 96 channels to be included in the input signal received by RF switch 412. Although not shown, the analog ASIC may include multiple RF inputs. The frequency of the received input signal ranges from about 900 MHz to about 2200 MHz.

The RF input of the analog ASIC is internally matched to 75 ohms so that no matching network between the cable connector and the ASIC input pin is required. RF switch 412 may be set for either normal or loop-through operation, as controlled by frequency synthesizer control interface module 406. The output signal of the RF switch is then amplified by the wide-band low noise amplifier ("LNA WB") 416 to help compensate for the insertion loss of other RF components in the analog processing. LNA WB 416 has a small signal gain that is greater than or equal to 25 dB over the entire operating frequency range of about 925 MHz to about 2050 MHz and a noise figure ("NF") of less than 1.5 dB. The power dynamic range of the input signal to LNA WB 416 is within −63 dBm to −11 dBm. For LNA WB 416, the input and output voltage standing wave ratio is less than 2:1.

Wide-band band pass filter ("BPF WB") 422 rejects unwanted out of band spurious and image frequency components, such as may be created in down converting satellite signals to the input signal. For example, although not shown, unwanted out of band spurious and image frequency components may be present below channel T1 and above channel Tn of FIG. 5A. The 3 dB pass-band is approximately 1125 MHz wide centered at about 1550 MHz with cut-off frequencies at about 925 MHz and 2050 MHz. The amplitude response of BPF WB 422 varies no more than about 0.2 dB and the phase response departs less than +/−3 degrees from linear phase shift, for any 63 MHz frequency band within the pass-band. Amplitude variation within the pass-band is less than 3 dB. The 40 dB stop-band frequencies at 725 MHz and 2250 MHz, and the amplitude response is at least 40 dB attenuated for both upper side and lower side frequencies of the stop-band. BPF WB 422 has an insertion loss of less than 3 dB.

The band-passed signal is then independently mixed with eight local oscillator frequencies. The local oscillator frequencies are generated by eight independent frequency synthesizers 428 (only frequency synthesizers 1, 2, 3, and 4 are shown), which are tuned by the synthesizer control module 406. Each frequency synthesizer 428 is essentially a phase lock loop design referenced to crystal oscillator (XO) 426. The output local oscillator frequency is phase locked to the input reference frequency and its frequency is scaled by a factor M/N to the input reference signal frequency. Each output signal is a sinusoidal waveform that does not exceed +8 dBm, with a frequency ranging from 560 MHz to 1760 MHz as controlled by an external microprocessor through a frequency synthesizer control interface module 468 (see FIG. 4B). The output frequency tuning resolution is 0.5 MHz or better and the output frequency offset is not more than 100 KHz from the tuned output frequency.

Two types of phase noise are specified for the output of each frequency synthesizer 428, continuous and spurious. Continuous phase noise is specified as a set of frequency break points with their associated power spectral density level. Power spectral density levels for the frequencies between these break points may be linearly extrapolated. The following power spectral densities for a given offset from a synthesizer frequency are applicable: for 1 KHz, less than or equal to −60 dBc/Hz; for 10 KHz, less than or equal to −85 dBc/Hz; for 100 KHz, less than or equal to −105 dBc/Hz; and for 1000 KHz, less than −125 dBc/Hz. Spurious phase noise within the signal frequency band (the synthesized output frequency +/−2.1 the maximum supported symbol rate) is no higher than −55 dBc/Hz level and spurious phase noise out of the signal frequency band is no higher than −45 dBc/Hz level.

XO 426 is a separate device from the analog ASIC. The output frequency ranges from about 3.5 MHz to about 70 MHz, with a frequency tolerance of +/−50 PPM and a frequency stability of +/−50 PPM over the XO's operating temperature of −10 degrees C. to +70 degrees C. Frequency drift due to aging is not more than +/−5 PPM/year. The drive level of XO 426 is not more than −3 dBm.

Using the output frequencies of frequency synthesizers 428, mixers 432 produce up to eight independent desired channels with the channel center frequencies positioned at two different intermediate frequencies, If1 and IF2 (only local oscillator frequencies LO1,1 and LO1,2, and mixers 432-1A and 432-1B are shown). Mixers 432 are one example of down conversion means for down converting a first channel to a first, relatively lower, intermediate frequency, and for down converting a second channel to a second relatively higher intermediate frequency. Down conversion means may further comprise crystal oscillator 426 and/or frequency synthesizers 428. Note that FIG. 4A only shows the signal paths for two channels being combined into a single sub-channel. Similar processing occurs for the other tuned channels, but the details are omitted from the drawing for clarity.

Figure 5B:
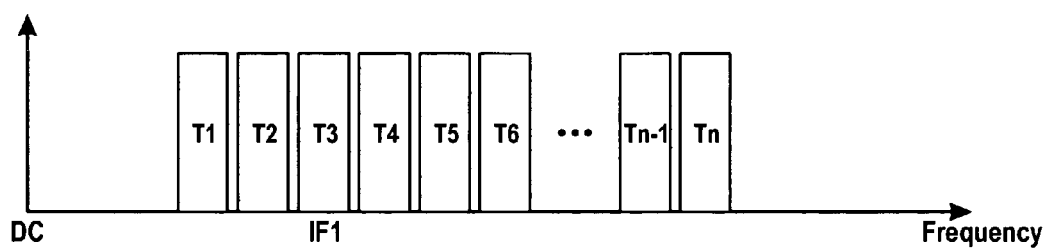
Figure 5C:
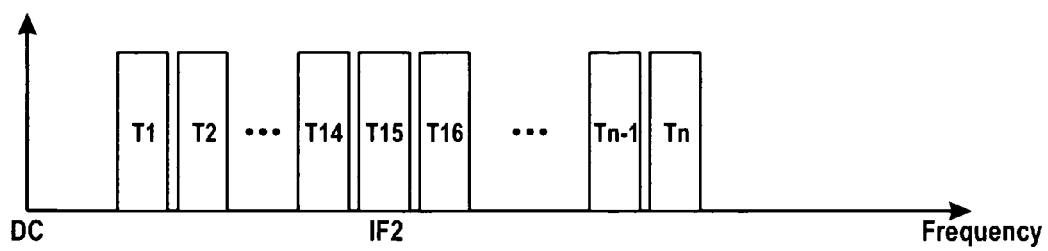

After mixing, each of the IF1 and IF2 signals remains a wide-band signal, which contains the composite transponder channels of the input signal. For example, FIG. 5B shows a desired channel T3 centered at IF1, and FIG. 5C shows a desired channel T15 centered at IF2. The relationship between the intermediate frequencies (IF1 and IF2), local oscillator frequencies (LO1,1 and LO1,2), and desired transponder channels (T3 and T15) is given by the following equations.

IF1=desired transponder channel T3 center frequency−LO1,1 frequency

IF2=desired transponder channel T15 center frequency−LO 1,2 frequency

IF2−IF1=transponder channel spacing

The transponder channel spacing depends on the satellite standard and the channel bandwidth.

Each mixer 432 has an RF input frequency range from about 950 MHz to about 2025 MHz, with a signal power dynamic range from −41 dBm to +11 dBm. The local oscillator ("LO") input frequency range is from about 560 MHz to about 1760 MHz, with a signal level of not more than about +8 dBm. IF1 is approximately 297 MHz and IF2 is approximately 360 MHz. The third order intercept point is at least +21 dBm and the insertion loss is no greater than 3 dB. Both the LO to IF isolation and the LO to RF isolation are at least 30 dB.

Figure 5D:
Figure 5E:
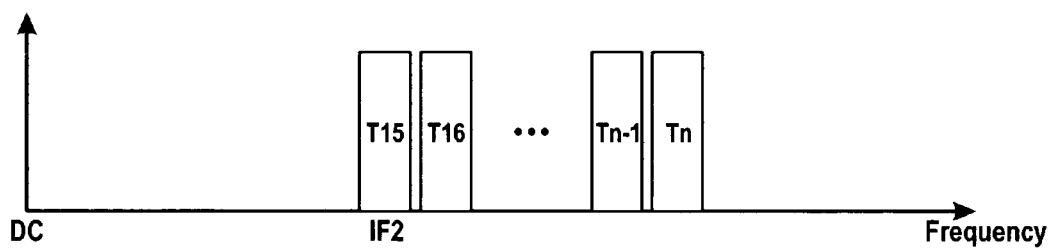
Figure 5F:
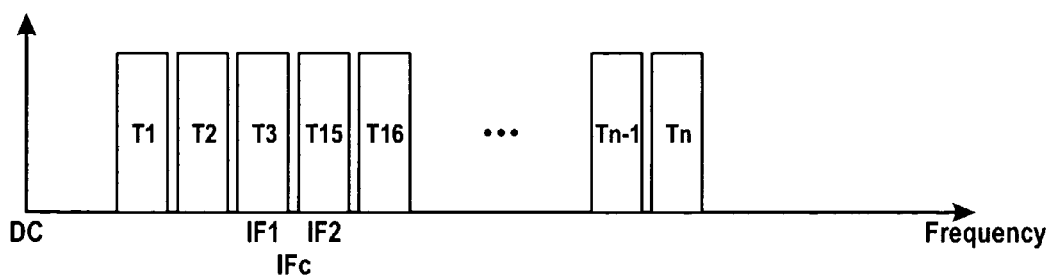

Variable low pass filters ("LPFs") 438 remove the upper side band transponders from the desired channel centered at IF1, and variable high pass filters ("HPFs") 435 remove the lower side band transponders from the desired channel centered at IF2, before power summers 437 combine IF1 and IF2 into a single sub-channel. (Only low pass filter 438-1A, high pass filter 435-2A, and power summer 437-1-2 are shown.) FIG. 5D shows channel T3, centered at IF1, after passing through low pass filter 438-1A, and FIG. 5E shows channel T15, centered at IF2, after passing through high pass filter 435-2A. FIG. 5F shows the filtered IF1 combined with the filtered IF2, at a frequency IFc, centered between the two channels. Low pass filters 438 are an example of first removal means for removing signals above the first channel, and high pass filters 435 are an example of second removal means for removing signals below the second channel. At this stage, the desired channels, T3 and T15, are adjacent to each other, regardless of the relative positions T3 and T15 occupied in the input signal.

Both low pass filters 438 and high pass filters 435 have a steep roll-off and configurable 3 dB cut-off frequency. The steep roll-off is desirable because after combining IF1 and IF2 to form two adjacent tuned channels, if the rejection of upper and lower side channels is not sufficient, excessive co-channel interference for each of the tuned channels, residing at IF1 and IF2, may be present. Since the architecture supports variable symbol rates from 1 MSPS to 45 MSPS, the variable 3 dB cut-off frequency helps to reject any undesired channels residing in the guard band between the two tuned channels.

For each low pass filter 438, the amplitude response varies no more than about 0.2 dB, and the phase response has less than +/−3 degrees departure from linear phase shift, for any 63 MHz frequency band within the pass-band from DC to (IF1+0.7 Rs) MHz, where Rs represents the quadratic phase shift keying ("QPSK") symbol rate. The amplitude variation within the pass-band is less than 1 dB. The 3 dB pass-band cut-off frequency is at (IF1+0.75 Rs) MHz and the 30 dB stop-band cut-off frequency is at (IF1+1.4 Rs) MHz. For frequencies higher than the stop-band cut-off frequency, the amplitude response is at least 30 dB attenuated. Insertion loss for low pass filters 438 is less than 3 dB.

For each high pass filter 435, the amplitude response varies no more than about 0.2 dB, and the phase response has less than +/−3 degrees departure from linear phase shift, for any 63 MHz frequency band within the pass-band, which is greater than or equal to about (IF2−0.7 Rs) MHz, where Rs represents the quadratic phase shift keying ("QPSK") symbol rate. The amplitude variation within the pass-band is less than 1 dB. The 3 dB pass-band cut-off frequency is at (IF2−0.75 Rs) MHz and the 30 dB stop-band cut-off frequency is at (IF2−1.4 Rs) MHz. For frequencies lower than the stop-band cut-off frequency, the amplitude response is at least 30 dB attenuated. Insertion loss for low pass filters 435 is less than 3 dB.

Power summers 437 combine the IF1 and IF2 signal paths to form a signal with a frequency spectrum that contains the two tuned channels with their center frequencies positioned at IF1 and IF2. As shown in FIG. 5F, both the upper and lower sidebands of this combined signal may contain undesired channels. The input and output frequency range for power summers 437 is from 50 MHz to 500 MHz, with an insertion loss of 3 dB or less. Power summers 437 are an example of signal combination means for combining the first intermediate frequency and the second intermediate frequency such that the first and second channel are adjacent to each other.

Band pass filters 439 reject undesired lower and upper sideband transponder channels after the IF1 and IF2 signal paths are combined by power summers 437 into a sub-channel of two tuned transponder channels that are adjacent to each other (only band pass filter 439-1-2 is shown). The rejection of undesired transponder channels helps the automatic gain control loop ("AGC") to operate properly since the architecture uses wide band analog to digital ("A/D") converters. (The AGC loop is described more fully below with reference to amplifiers 436, A/D converters 442, and FIG. 4B). Rejecting undesired channels prevents A/D saturation when a high signal level is present at its input and helps translate the desired analog signal to a digital format. Band pass filters 439 are an example of third removal means for removing signals below the first channel and signals above the second channel from the combined first and second intermediate frequencies.

Figure 5G:

For band pass filters 439, the amplitude response varies no more than about 0.2 dB, and the phase response has less than +/−3 degrees departure from linear phase shift, for any 63 MHz frequency band within the pass-band from (IF1−0.7 Rs) MHz to (IF2+0.7 Rs) MHz. The amplitude variation within the pass-band is less than 0.4 dB. The 3 dB pass-band frequencies are at (IF1−0.75 Rs) MHz and (IF2+0.75 Rs) MHz and the 30 dB stop-band frequencies are at (IF1−1.4 Rs) MHz and (IF2+1.4 Rs) MHz. For frequencies lower or higher than the stop-band frequencies, the amplitude response is at least 30 dB attenuated. Insertion loss for band pass filters 439 is less than 3 dB. FIG. 5G shows the combined channels T3 and T15, after a band bass filter 439 has removed undesired upper and lower sideband channels, with IFc being the center frequency of the channel pair.

Gain control amplifiers ("AMPs") 436 are second stage amplifiers that precede A/D converters 442 (only amplifier 436-1-2 and A/D converter 442-1-2 are shown). The gain level of amplifiers 436 is varied by a feedback and control AGC loop (only AGC1,1 is shown). The AGC loop estimates the input signal level to the A/D converters 442 and configures the corresponding gain levels to satisfy the preset operating input signal level of the A/D converters. The estimation is part of the digital ASIC shown in FIGS. 4B through 4D. The signal level estimation result is used to adjust AMPs 436 through a micro-controller. The update rate of the AGC loop is a function of both the changes in input signal level rate and the observation interval of the estimation function for providing a particular level of accuracy. AMPs 436 have a signal gain of up to 35 dB over the entire operating frequency range from DC to about 500 MHz, a linear gain control range of 50 dB, and a noise figure (NF) of less than 6 dB. The input signal power dynamic range is within −50 dBm to −10 dBm. For AMPs 436, the input and output voltage standing wave ratio is less than 2:1. AMPs 436 are an example of amplification means for increasing the strength of the resulting multiple channel intermediate frequency signal, and the corresponding AGC loops are an example of means for automatically controlling the gain of the amplification means.

Figure 5H:
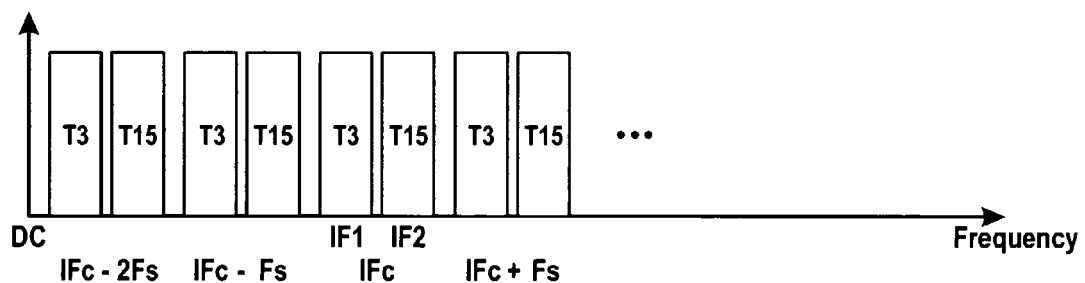

A/D converters 442 convert the input IF analog signal to 8 bits of digital output data with a two's complement binary data format. The output digital signal spectrum contains the original analog input spectrum and sets of images residing at IFc+/−N*Fs, as shown in FIG. 5H. As above, IFc is the center frequency of the channel pair T3 and T15, or (IF1+IF2)/2. A/D converters 442 operate with the following performance over the input bandwidth from DC to 500 MHz. The output signal to noise ratio ("SNR") without harmonics and spurious-free dynamic range ("SFDR") distortions is better than 45 dB. Output SNR with harmonics and SFDR distortions is better than 42 dB. The input sampling clock rate does not exceed 135 MSPS. A/D converters 442 are examples of digital conversion means for producing a digital representation of the resulting multiple channel intermediate frequency signal.

A/D converters 442 are shown as dashed because optionally they may be part of the digital demodulator and decoder ASIC shown in FIGS. 4B-4D. Therefore, FIG. 4A shows an analog version of a first sub-channel (channel T3 tuned by frequency synthesizer 1 and channel T15 tuned by frequency synthesizer 2) labeled AS1-1-2, and a digital version of a first channel, labeled DS1-1-2, etc. The transponder channels shown in FIGS. 5A-5H may be tuned by any of the signal paths. Furthermore, if A/D converters 442 are part of the analog ASIC illustrated in FIG. 4A, FIG. 5H may represent the DS1-1-2 output of A/D converter 442-1-2. Alternatively, if A/D converters 442 are part of the ASIC illustrated in FIGS. 4B-4D, FIG. 5G may represent the output of AMP 436-1-2, labeled AS 1-1-2. As noted previously, FIG. 4A does not show all signal paths, but the processing of the signal paths not shown is similar to the signal paths illustrated and described in connection with FIG. 4A.

The tuned channels, such as channel T3 and T15 of FIG. 5H, are digitally converted to baseband and undergo further digital signal processing for data recovery, as will be discussed below in greater detail with reference to FIGS. 4B-4D. Note that FIGS. 4B-4D show only the processing of one sub-channel that includes a pair of tuned transponder channels. The upper signal path, beginning with mixers 449-1A and 449-1B, processes one of the tuned transponder channels, and the lower signal path, beginning with mixers 449-2A and 449-2B, processes the other tuned transponder channel. Similar processing occurs for the other sub-channels and will not be described or illustrated separately.

As noted above with respect to FIG. 4A, A/D converters 442 are shown as dashed because they may be part of the analog ASIC illustrated in FIG. 4A rather than the digital ASIC illustrated in FIGS. 4B-4D. Alternatively, A/D converters 442 may be present in both the analog ASIC and the digital ASIC. If A/D converters 442 are part of the analog ASIC, signal DS1-1-2 includes channels T3 and T15 as shown in FIG. 5H. Otherwise, signal AS1-1-2 includes channels T3 and T15 as shown in FIG. 5G. Digital switch 446 enables selection of digital input from an internal or external A/D converter, depending on the particular implementation. The digital switch may be implemented as a digital mutiplexer with a single bit control signal, where the digital ASIC configuration parameters include the control bit. A total of 4 multiplexers and one common control signal are used in supporting 8 channels.

Numerically controlled oscillators ("NCOs") 445 and mixers 449 digitally down convert the modulated carrier of a desired image channel to baseband (only NCOs 445-1 and 445-2, and mixers 449-1A, 449-1B, 449-2A, and 449-2B are shown). NCOs 445 generate quadrature sin/cos outputs with a fundamental frequency equal to the modulated carrier center frequency input of the corresponding digital mixer (multipliers 449). Four channel pairs are supported, with two different NCOs generating two different local oscillator frequencies for each channel pair. Mixers 449 may be implemented as 8×8 digital multipliers.

NCO 445-1 synthesizes the local oscillator intermediate frequency that is used to down convert the lower side tuned channel to baseband. The output frequency is about 37 MHz, but NCO 445-1 may be configured and is capable of synthesizing any frequency from DC to about 65 MHz with a resolution of approximately 1 kHz. A lookup table for NCO 445-1 may be implemented as a single port 8×16 ROM or RAM. The spurious free dynamic range of NCO 445-1 is less than −45 dBc. A configurable frequency word parameter may be used to control the output frequency of NCO 445-1.

NCO 445-2 synthesizes the local oscillator intermediate frequency that is used to down convert the upper side tuned channel to baseband. The output frequency is about 100 MHz, with a spurious free dynamic range criteria of less than −45 dBc. A configurable frequency word parameter may be used to control the output frequency of NCO 445-2. Given a sampling frequency of 130 MHz and an output frequency of 100 MHz, some traditional NCO designs may not be appropriate for NCO 445-2. One of many suitable designs for NCO 445-2, therefore, is described below. When a digital representation of a sinusoidal wave is generated at an output frequency that is near to or greater than one half the sampling rate, various samples are taken over multiple cycles and stored in a circular shift register. The number of samples to be taken and the number of cycles over which the samples are accumulated depends on the sampling rate (e.g., system clock frequency) and the desired output frequency.

First, a greatest common factor of the sampling rate and desired output frequency is calculated. For instance, if the sampling rate were 130 MHz and the desired output frequency were 100 MHz, the greatest common factor would be ten. Then, the number of samples that are to be buffered is determined by dividing the sampling rate by the greatest common factor. In the given example, if the sampling rate were 130 MHz and the greatest common factor were ten, the number of samples would be thirteen. Finally, the number of cycles over which the samples are accumulated is determined by dividing the desired output frequency by the greatest common factor. Returning to the example, if the desired output frequency were 100 MHz and the greatest common factor were 10, ten cycles would be needed to accumulate the thirteen samples.

For NCO 445-2, thirteen samples may be taken over a period of ten cycles and stored in a circular shift register. Since ten is a whole number, the values of samples from subsequent groups of ten cycles will be identical to those values sampled from the first ten cycles assuming no change in the desired output frequency. Since the sample values are identical, once the first thirteen sample values have been stored, no other sampling is needed. To generate a sinusoidal waveform at the desired output frequency (e.g., 100 MHz), the thirteen stored values are output sequentially at an appropriate rate.

Bit selectors 451, normalize the outputs of mixers 449 to 8 significant bits prior to processing by infinite impulse response low pass filters ("IIR LPFs") 453 (only bit selectors 451-1A, 451-1B, 451-2A, and 451-2B, and IIR LPFs 453-1A, 453-1B, 453-2A, and 453-2B are shown). IIR LPFs 453 reject the undesired adjacent channel from the desired channel being processed. The center modulated IF of the undesired channel is positioned at 1.4 Rsmax (63 MHz). For the upper channel path of a channel pair, the desired channel is the first tuned channel with IF positioned at 37 MHz before being mixed down to baseband, and the undesired channel is the second tuned channel with IF positioned at 100 MHz before being mixed down to 63 MHz. For the lower channel path of a channel pair, the desired channel is the second tuned channel with IF positioned at 100 MHz before being mixed down to baseband, and the undesired channel is the first tuned channel with IF positioned at 163 MHz before being mixed down to 63 MHz.

For IIR LPFs 453, the amplitude response of the filter varies no more than 0.1 dB and the phase response has less than +/−1 degree departure from linear phase shift within the pass-band from DC to 0.7 Rsmax MHz. The 3 dB pass-band cut-off frequency is at 0.75 Rsmax MHz and the 45 dB stop-band cut-off frequency is at 1.4 Rsmax MHz. For frequencies higher than the stop-band cut-off frequency, the amplitude response is at least 45 dB attenuated. The maximum modulated symbol rate, Rsmax, is 45 MSPS.

As mentioned above with respect to AMPs 436 of FIG. 4A, the AGC loop referenced as AGC1 448-1, AGC2 448-2, and AGC decision logic 447-1-2, regulates the analog A/D input signal such that the digital output is represented by an appropriate number of significant bits. Eight bits are used to satisfy receiver performance needs, including minimizing quantization noise. The dynamic range for the L-band input signal is 46 dB, and an 8-bit A/D provides a 48 dB dynamic range output. The AGC loop assures optimal use of the 8-bits provided by A/D converters.

The AGC loop begins by taking the I and Q components from the digital IIR LPFs 453. A digital signal envelope is formed from these I and Q digital samples (i.e., SQRT(I2+Q2)). The envelope is subtracted from the desired reference signal level. The difference (error signal) is filtered to eliminate broad band noise before being fed to a lookup table for address indexing. The digital output from the lookup table is converted to an analog signal and used to control the gain for AMPs 436 (FIG. 4A). The L-band input sensitivity range is from −20 dBm to −69 dBm. The variable gain resolution for AMPs 436 is 1 dB or less, with an acquisition time for the AGC loop of less than 10 kSymbols.

DC offset filters 452 estimate the DC bias level of the input signal (only DC offset filters 452-1 and 452-2, and corresponding components 452-1A, 452-1B, 452-2A, and 452-2B are shown). The estimated DC bias is subtracted from the I and Q components of each tuned channel following the filtering of IIR LPFs 453. The DC offset filters 452 support up to +/−9 LSBs of the A/Ds. Setting a DC bias register to a zero value allows DC offset filters 452 to be bypassed.

FIG. 4B also shows a clock tree and several interfaces. In clock network 462, all independent clocks are synchronized. External microprocessor interface 464 provides for communication with an external microprocessor. Analog filter control interface 466 is used to control the variable analog filters through filter control module 402 (FIG. 4A), such as by altering the cut-off frequency based on symbol rate. Frequency synthesizer control interface 468 tunes the frequency synthesizers through frequency synthesizer control module 406 (FIG. 4A) to produce the signals used in down converting to an intermediate frequency, such as IF1 and IF2.

Figure 3A:
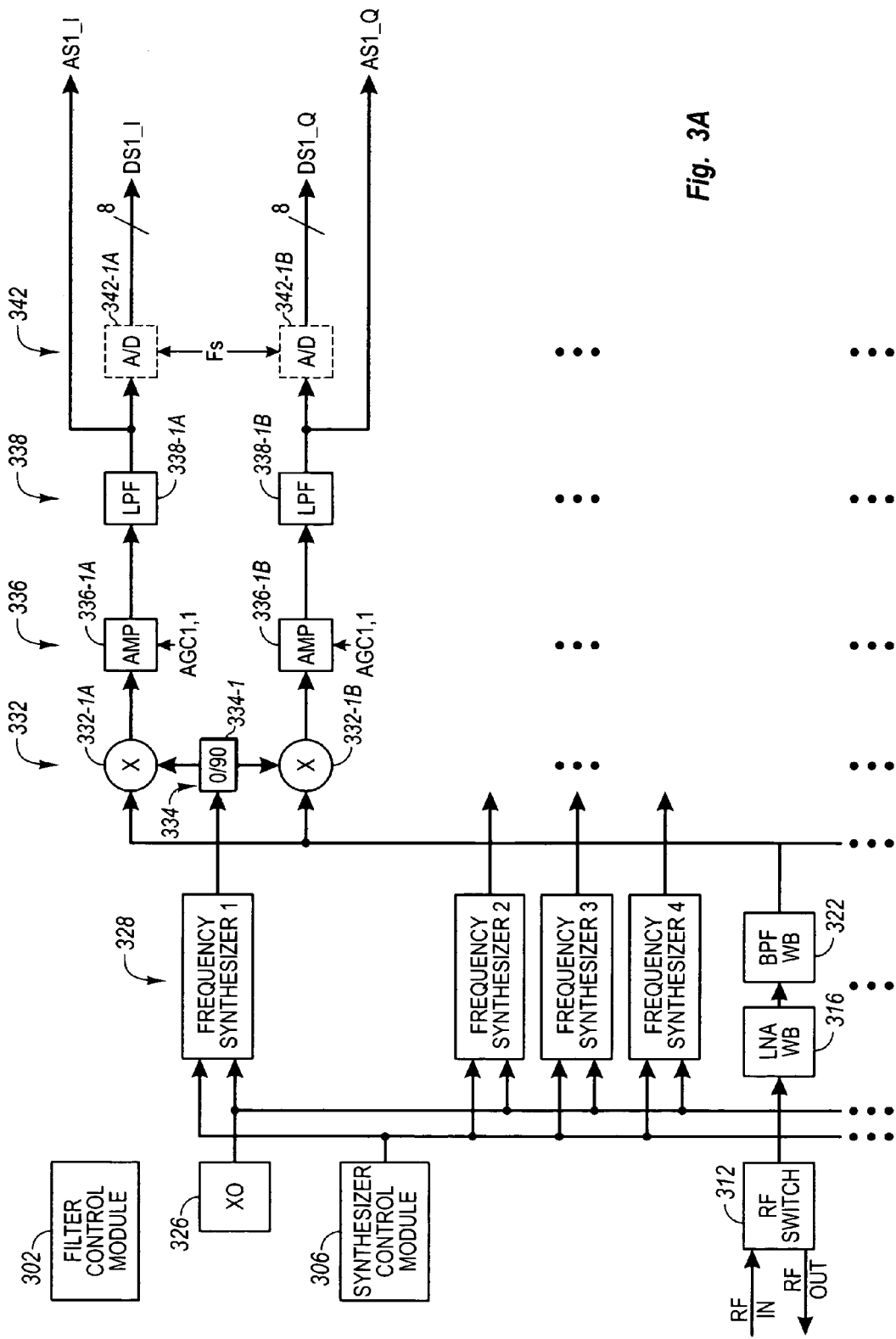
FIGS. 3A-3D are block diagrams illustrating certain portions of a system that does not practice the present invention.
Figure 3B:
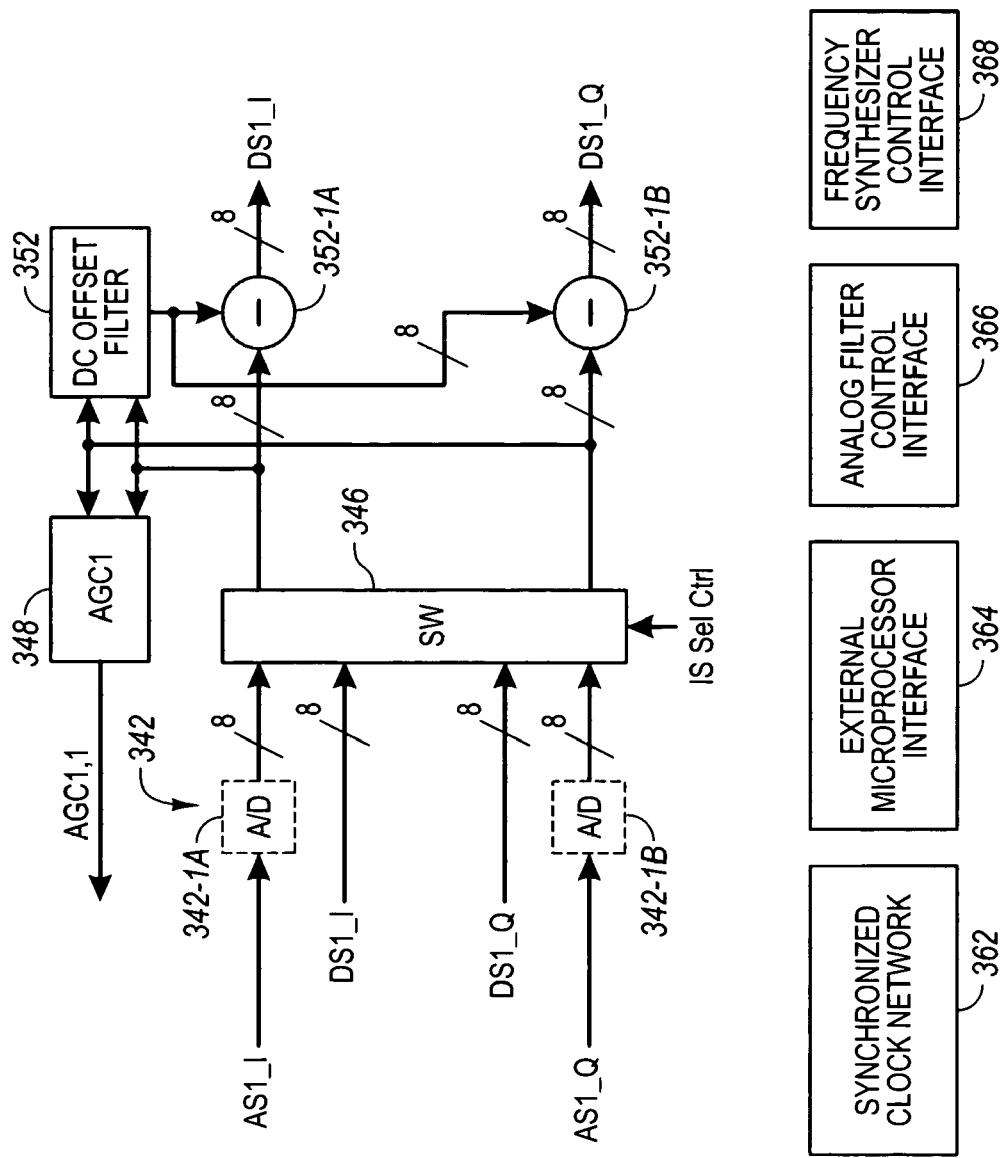
Figure 3C:
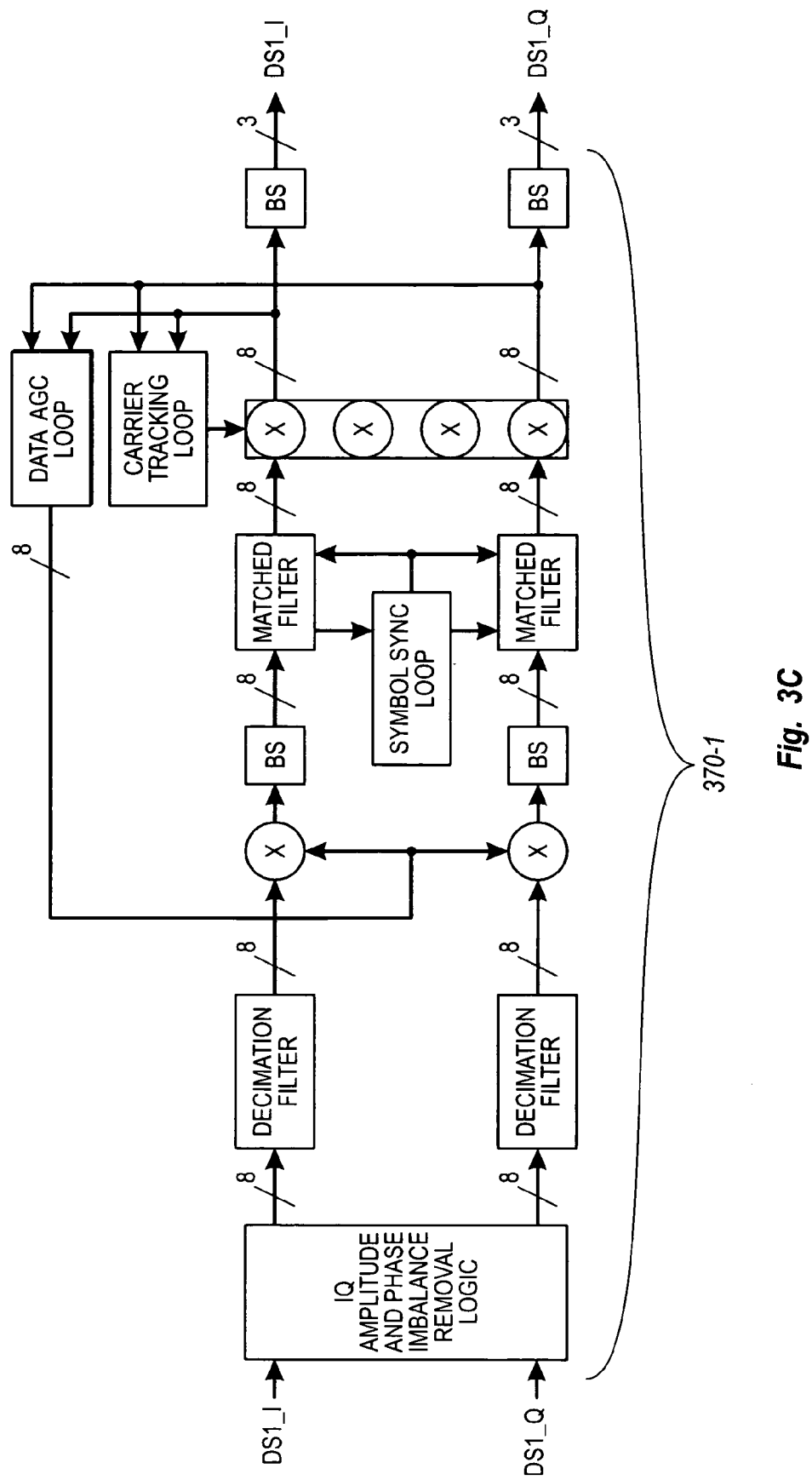
Figure 3D:
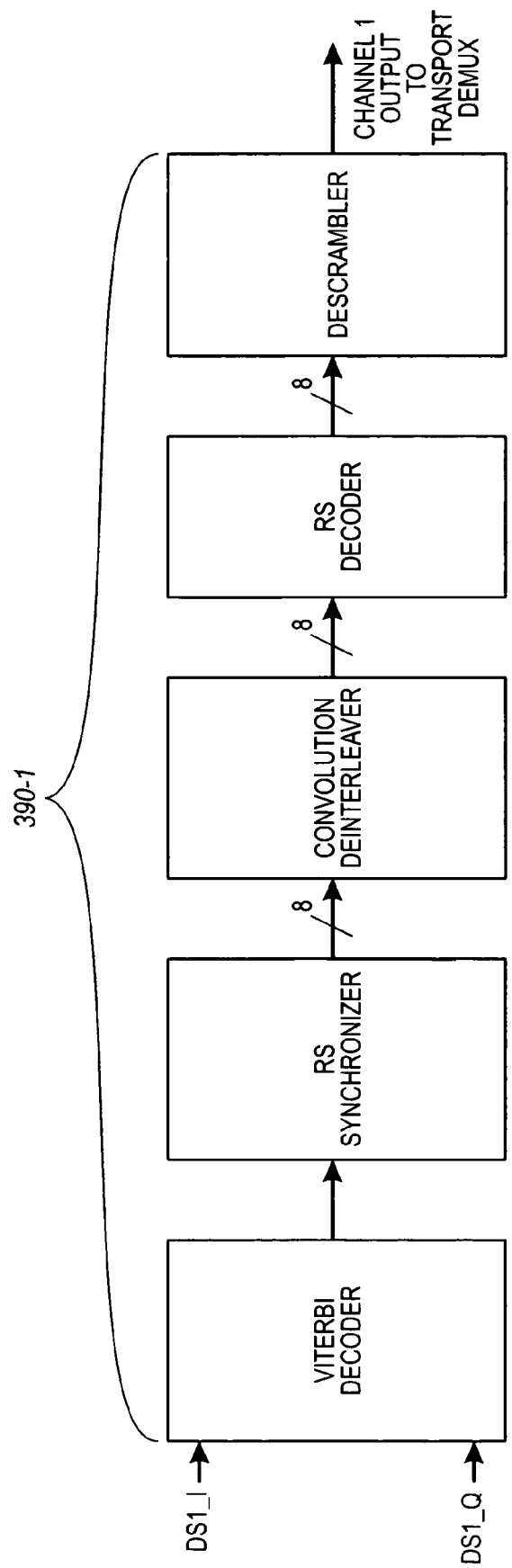

Turning next to FIGS. 4C and 4D, notice that the processing is similar to that described with respect to FIGS. 3C and 3D, except that FIGS. 4C and 4D illustrate the processing of the I and Q components (DS1_I, DS1_Q, DS2_I and DS2_Q) of two channels (a channel pair), whereas FIGS. 3C and 3D illustrated the processing of the I and Q components of one channel. Processing the I and Q components for the first channel, such as transponder channel T3, is referenced as processing 470-1 and 490-1, and processing the I and Q components of the second channel, such as transponder channel T15, is referenced as processing 470-2 and 490-2. Because some form of the processing shown in FIGS. 4C and 4D usually occurs whether the present invention is practiced or not, the description corresponding to FIGS. 4C and 4D is somewhat abbreviated.

The I/Q amplitude and phase imbalance processing provides automatic I/Q amplitude and phase corrections. These imbalances could be caused by the modulation process, such as gain distribution variations between the I and Q components, and imbalance in the 90 degree phase splitter. The design supports up to 6 db of I and Q amplitude imbalance and up to +/−6 degrees of I and Q phase imbalance.

A low pass filter and decimation chain is used to reduce the sampling rate that flows into the match filters for relatively low QPSK symbol rates, given that the system clock may be fixed at 130 MHz. This rate reduction helps optimize logic gate utilization for the matched filters and other circuits down the digital processing chain. A total of five half-band filter and decimation sections are used to support symbol rates from 1 to 45 MSPS. The matched filter is a variable rate square root raised cosine ("SRRC") filter, which is designed to accept input sampling rates from 2 to 4 samples per symbol. I and Q multiplexers are taped to all different filter/decimation section outputs. The selection of these outputs is based on symbol rate information. For example, (Fs) is used if Fs/4<Rs<=Fs/2; (Fs/2) is used if Fs/8<Rs<=Fs/4; (Fs/4) is used if Fs/16<Rs<=Fs/8; (Fs/8) is used if Fs/32<Rs<=Fs/16, (Fs/16) is used if Fs/64<Rs<=Fs/32; and (Fs/32) is used if Fs/128<Rs<=Fs/64, where Fs is the system clock rate of the ASIC and Rs is the symbol rate. Decimation is implemented as throwing away every other sample.

A half-band filter is used to reject any potential undesired frequency components from being folded back into the desired band during the down sampling process. The amplitude response of each half-band filter varies no more than 0.1 dB within the pass-band from DC to 0.7 Rs MHz. The 3 dB pass-band cut-off frequency is at ¼ of the filter processing rate and the 45 dB stop-band cut-off frequency is at ½ of the filter processing rate. The amplitude response is at least 45 dB attenuated for frequencies higher than the stop-band cut-off frequency. The phase response allows for less than +/−1 degree departure from linear phase shift within the pass-band.

There are two matched filters for each channel path for I and Q. The matched filter is used to account for power shaping that may occur at the transmitting end. For example, both the DirecTV® and DVB standards employ SRRC filtering for pulse shaping effects at the transmitting end. The SRRC filter roll-off factor (alpha) for DirecTV® and DVB are 20% and 35%, respectively. The roll-off factor translates to a percentage of two-sided excessive bandwidth relative to the transmitted symbol rate. The lower alpha value translates to heavier shaping of the original power spectrum density, and hence higher bandwidth efficiency.

For SRRC transmit pulse shaping, the receiver matched filter is identical to the transmitting filter. A finite impulse response ("FIR") filter is recommended to implement the matched filters. The implementation may be optimized for logic gate utilization by employing a time varying FIR filter design, which is essentially a coefficients interpolation. The implementation performance loss of the matched filter design is less than 0.1 dB.

The symbol synchronization loop ("SSL") provides correct symbol detection timing for sampling at the I and Q matched filter outputs when the loop is locked. This helps produce maximum symbol energy versus noise spectral density, during sampling from the output of the match filters, which provides optimum symbol detection performance. The symbol synchronization loop also helps track potential clock jitter and the jitter rate created by both the transmit and receive reference clocks. For reference clock stability of up to +/−200 PPM, the symbol synchronization loop acquisition time is less than or equal to 100 kSymbols with an Eb/NO level greater than or equal to 3 dB. Implementation loss for the tracking performance of the SSL is less than 0.1 dB. The SSL includes a timing error detector, a loop filter, and an NCO.

A data transition tracking loop ("DTTL") is employed for symbol timing synchronization. The DTTL integrates in-phase and mid-phase of the I and Q matched filter outputs over one symbol time period. The I arm detects whether peak timing in term of maximum Es/No has been advanced or retarded between two consecutive symbols. The Q arm detects the level of timing error when a symbol transition occurs. The sampling rate out of the I and Q matched filters is identical to the matched filter input rate, which is between 2 to 4 samples per symbol.

The SSL filter is essentially a single pole low pass filter. The SSL filter removes broad band noise from the timing error signal. The implementation of the SSL filter is similar to the carrier tracking loop filter, described below. The SSL bandwidth is controlled by the SSL filter. One filter implementation uses two digital multipliers, two bit selectors, an accumulator, and an adder. The digital multipliers and bit selectors are each controlled and configured by separate parameters used in tuning the loop. The filter produces a 26-bit output signal that is used for both acquisition and tracking.

The SSL NCO generates a symbol rate clock with maximum Es/No sample timing. The symbol rate clock (Rs clock) is used to sample the I and Q matched filter outputs. The NCO generates a 9-bit address for the interpolated FIR match filter coefficients table lookup. The NCO input is the filtered timing error signal. The 26-bit filtered timing error input signal basically is a correcting factor to a 27-bit configured symbol rate clock parameter. The 27-bit symbol rate clock parameter is part of the initial parameter set downloaded to the digital ASIC. The sum of these two parameters is fed to a 27-bit modulo accumulator for producing both the Rs clock and the 9-bit matched filter coefficients address. The sampling rate for this NCO is identical to the matched filter input rate, which is between 2 to 4 samples per symbol. The performance of the NCO is dictated by the overall acquisition and tracking performances for the SSL.

A complex phase de-rotation block removes frequency offset estimated by the digital carrier tracking loop. As inputs, this block takes the 8-bit I and Q components from the matched filters, and sine and cosine terms from the carrier tracking loop's estimated frequency and phase. The outputs of the block are given by the following equations:

$$Complex = (I+jQ)*(Cos+j Sin)$$

$$Real = I*Cos - Q*Sin$$

$$Imag = Q*Cos - I*Sin$$

Where Cos and Sin have estimated frequency and phase arguments, and Real/Imag are the I and Q outputs.

The digital carrier tracking loop phase locks to the modulated signal phase such that symbol detection can be made. The second order digital phase locked loop is designed to track both the frequency and phase of the modulated signal. A phase slicer error detector forms the complex phase de-rotation I and Q outputs into a phase error signal. The phase slicer error detector calculates the input phase by taking the Arctangent, of its I and Q inputs. The input phase is subtracted by a 45 degree slice of the complex plane to form an 8-bit phase error signal. The phase slicer error detector may be implemented with simple logic circuitry and a 16k×8 single port RAM.

Next, the 8-bit phase error signal from the phase detector output is fed through a loop filter to filter broad band noise prior to processing by an NCO. The loop filter controls the overall carrier tracking loop bandwidth. One filter implementation uses two digital multipliers, two bit selectors, an accumulator, and an adder. The digital multipliers and bit selectors are each controlled and configured by separate parameters used in tuning the loop. The filter produces a 20-bit output signal that is used to synthesize an estimated offset frequency and phase by the NCO.

The NCO generates both sine and cosine 8-bit signals with frequency and phase arguments locked to the modulated signal. These output sine and cosine signal are applied to the complex phase de-rotator to remove frequency offset and provide phase locking to the modulated signal, thereby closing the loop. Because the operating rate of the loop is the symbol rate, the output frequency resolution (Rs/221) is dependent on the symbol rate as well. For symbol rates ranging from 1 MSPS to 45 MSPS, output frequency resolution can be varied from 0.477 to 21.458 Hz. The frequency sweep control parameter should be reconfigured during operation. Furthermore, since false carrier locking can occur during carrier acquisition, a carrier acquisition algorithm may be needed to recognize a false carrier locked condition and reset the carrier acquisition process.

The loop is designed to track a modulated signal frequency offset of as much:as +/− one quarter of the operating symbol rate (1 to 45 MSPS). The loop acquisition time is less than 100 kSymbols with Eb/NO level of greater than or equal to 3 dB. The loop also provides carrier acquisition and tracking with Eb/NO threshold as low as 1 dB. Performance losses of the loop implementation are no higher than 0.1 dB.

The data AGC loop regulates the I and Q digital signal level into the matched filters such that 3 soft decision bits can be selected out of the matched filters for optimum Viterbi decoding. The I and Q inputs are taken out of the complex phase de-rotator output. A digital signal envelope (SQRT(I2+Q2)) is formed from the I and Q samples. The envelope signal is then subtracted from the desired reference signal level, with the difference (error signal) being filtered to eliminate broad band noise before it is fed to a table lookup for address indexing. The digital output of the table lookup is used to adjust the input signal level into the matched filters. The input sensitivity range is from −128 to +127 quanta for both I and Q signals. The gain adjustment resolution for the data ABC loop is 1 quanta and the acquisition time for the loop is less than 2 kSymbols.

Turning next to FIG. 4D, the Viterbi decoder is essentially a trellis decoding with the number of states in the trellis corresponding to 2(K−1). The decoder computes metrics of the four possible paths for each symbol, which are proportional to the Euclidian distance between the received I and Q and the theoretical symbol value. Each state of the trellis has two paths merging in from two different states of the previous bit time. An add-compare-select circuit is used to determine the surviving path for each state of the trellis. A minimum of 3-bit soft decision is used for computing branch metrics, which ensure that the coding gain requirement is met. The decoder puncture rate is a programmable parameter.

Reed-Solomon packet synchronization is monitored and detected by a simple up/down counter which counts up by 1 every time a unique byte is detected with the correct timing. The unique byte detection circuitry can be implemented by an 8-bit correlator. When a threshold value is reached, packet synchronization is declared. The threshold value is programmable. Packet synchronization formats the output bit stream of the Viterbi decoder to an RS code word format with the correct boundary.

Interleaving disperses potentially long bursts of errors. Long bursts of errors that occur within an RS code word can result in a decoded error since the correctable errors within an RS code word is limited to T, which is (N−K)/2, where T is the upper limit of correctable errors within an RS code word, N is the code word length, and K is the length of information being encoded. There are two potential sources of burst errors, mainly due to channel condition and the Viterbi decoder. The convolution deinterleaver reorders RS code words to their ordering prior to interleaving.

RS coding may be used as an outer code to correct inner Viterbi decoded errors, which tend to be burst errors. RS coding tends to perform well under burst error conditions. The shortened RS codes used in DirecTV® and DVB are able to correct up to eight byte errors within a code word.

The descrambler recovers data by removing the randomizing pattern used for energy dispersal. It also changes the inverted synchronization byte to its normal byte value. To provide an initialization signal for the descrambler, the MPEG-2 synchronization byte of the first transported packet in a group of eight packets is complemented from (47)hex to (B8)hex. All synchronization bytes in the transport stream are not scrambled from the transmit end. Therefore, all synchronization bytes need not apply through the entire descrambler block.

Note that in the discussion of direct down conversion with respect to FIGS. 3A-3D, above, each channel in the input signal was immediately converted to baseband and separated into its I and Q components, resulting in sixteen separate signal paths when simultaneously tuning eight separate channels. In contrast, using the intermediate frequency sub-sampling and the present invention, two channels are combined into one sub-channel, resulting in four signal paths when simultaneously tuning eight separate channels. FIG. 6 shows the components used in direct down conversion according to FIGS. 3A-3D compared to the components used in intermediate frequency sub-sampling according to the present invention and the embodiment shown in FIGS. 4A-4D. Of particular significance, the present invention uses only 4 analog to digital converters and 4 control amplifiers to simultaneously tune 8 independent channels, whereas direct down conversion uses 16 analog to digital converters and 16 control amplifiers. Therefore, the present invention greatly facilitates a single integrated circuit implementation for the analog processing needed in simultaneously tuning multiple channels contained within a received input signal.

The present invention may be practiced in many environments and is not limited to processing any particular type of data. For example, the present invention may be used to process channels that contain video, audio, electronic program guides, control signals, electronic publications (such as magazines, newspapers, and the like), software, scripts, Internet content, etc., other broadcast data, and combinations thereof. Using the present invention in the environment shown in FIG. 2, a single management system is capable of tuning channels for multiple televisions, digital video recorders, personal computers, or any other devices.

With multiple channels available for tuning, the present invention allows for the dedication of one or more channels to monitoring a particular channel for software upgrades, advertisements, electronic magazine or newspaper subscriptions, or other broadcast data. Furthermore, a system such as the one illustrated in FIG. 2 may be addressable, such that instructions or control signals may be sent over a monitored channel to an individual system. The instructions or control signals may cause the management system to initiate contact with other networks over a bi-directional communication link to receive additional data, including further instructions. In this manner, the system could be accessed remotely and instructed to record a particular channel that includes a broadcast movie or sporting event of interest.

The present invention also may be described in terms of methods comprising functional steps and/or non-functional acts. The following is a description of acts and steps that may be performed in practicing the present invention, relate generally to FIGS. 4A and 4D. Usually, functional steps describe the invention from a perspective of results that are accomplished, whereas non-functional acts describe more specific actions for achieving a particular result. Although the functional steps and non-functional acts may be described or claimed in a particular order, the present invention is not necessarily limited to any particular ordering of the acts and/or steps.

The present invention may include a step for down converting a first channel to a first intermediate frequency and a step for down converting a second channel to a second intermediate frequency, wherein the second intermediate frequency is relatively higher than the first intermediate frequency. An act of mixing a first channel to a first intermediate frequency and an act of mixing a second channel to a second intermediate frequency may be used to achieve the result of down converting one or more channels to an intermediate frequency. A step for removing signals above the first channel from the first intermediate frequency and a step for removing signals below the second channel from the second intermediate frequency may comprise an act of filtering the first intermediate frequency to remove signals above the first channel and an act of filtering the second intermediate frequency to remove signals below the second channel from the second intermediate frequency.

A step for combining the first intermediate frequency and the second intermediate frequency such that the first channel and the second channel are adjacent to each other may include an act of summing the first intermediate frequency and the second intermediate frequency. Similar to the above steps for removing signals, a step for removing signals below the first channel and above the second channel, such that a resulting multiple channel intermediate frequency signal contains the adjacent first and second channels may comprise an act of filtering the combined first intermediate frequency and second intermediate frequency to remove signals below the first channel and above the second channel.

A step for increasing the strength of the resulting multiple channel intermediate frequency signal in accordance with an automatic gain control signal may include an act of amplifying the resulting multiple channel intermediate frequency signal. A step for producing a digital representation of the resulting multiple channel intermediate frequency signal may include an act of converting the resulting multiple channel intermediate to a digital representation with an analog to digital converter. A step for down converting the digital representation of the multiple channel intermediate frequency signal to position each of the adjacent first and second channels at baseband may comprise an act of digitally mixing the digital representation of the multiple channel intermediate frequency signal to position each of the adjacent first and second channels at baseband.

A step for separating the in-phase and quadrature components of the first and second channels also may include an act of digitally mixing the digital representation of the multiple channel intermediate frequency signal. Again, as above, a step form removing signals other than a desired in-phase and quadrature component from each channel may comprise filtering the in-phase and quadrature components of each channel to remove signals other than the desired in-phase and quadrature component.

A step for removing a direct current offset from at least one of the in-phase and quadrature components of either the first or second channel may include an act of subtracting a direct current offset from at least one of the in-phase or quadrature components of either the first or second channel. A step for varying a cut-off frequency used in at least one of the steps for removing signals may include an act of adjusting a cut-off frequency based at least in part on a symbol rate.

The present invention may further comprise acts of: setting the first and second intermediate frequency based on a frequency synthesizer control module; receiving a wide-band input signal that includes the first channel and the second channel; amplifying the received wide-band signal; and filtering the amplified wide-band input signal to remove signals outside of a desired range of channel frequencies.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A computer program product comprising one or more computer-readable storage media storing computer-executable instructions that when executed implement a method of combining at least two channels, selected from a plurality of channels received at a system, into one subchannel such that certain signal processing may be performed on the one subchannel, wherein the certain signal processing of the one subchannel requires fewer of certain components than would be required to process the at least two channels separately, wherein the method comprises:

mixing a first channel to a first intermediate frequency, the first channel being received in one or more signals;

mixing a second channel to a second intermediate frequency, the second channel being received in the one or more signals and tuned to simultaneously with the first channel, wherein the second intermediate frequency is relatively higher than the first intermediate frequency, and wherein the one or more signals that include the first channel and the second channel, when received, also includes one or more additional channels between the first and second channels;

after mixing the first channel, filtering the first intermediate frequency to remove all channels above the first channel from the first intermediate frequency;

after mixing the second channel, filtering the second intermediate frequency to remove all channels below the second channel from the second intermediate frequency;

after filtering the first and second intermediate frequencies, summing the first intermediate frequency and the second intermediate frequency, wherein summing the first intermediate frequency and the second intermediate frequency combines the first intermediate frequency and the second intermediate frequency such that the first channel and the second channel are adjacent to each other and have no intervening channels therebetween, such that all of the one or more additional channels that were between the first and second channels when the one or more signals were received, are absent after combining the first intermediate frequency and the second intermediate frequency; and filtering the combined first intermediate frequency and second intermediate frequency to remove channels below the first channel and above the second channel, such that a resulting multiple channel intermediate frequency signal contains only the adjacent first and second channels.

2. A computer program product as recited in claim 1, wherein the method further comprises amplifying the resulting multiple channel intermediate frequency signal in accordance with an automatic gain control signal.

3. A computer program product as recited in claim 2, wherein the method simultaneously combines at least eight channels into four separate subchannels, and wherein the method is practiced within a single integrated circuit.

4. A computer program product as recited in claim 2, wherein the method further comprises converting the resulting multiple channel intermediate frequency signal to a digital representation with an analog to digital converter, wherein the automatic gain control signal is based at least in part on an appropriate input signal level for the analog to digital converter.

5. A computer program product as recited in claim 4, wherein the method further comprises:

digitally mixing the digital representation of the multiple channel intermediate frequency signal to position each of the adjacent first and second channels at baseband and to separate the inphase and quadrature components of the first and second channels; and filtering the inphase and quadrature components of each channel to remove signals other than the desired inphase or quadrature component of each channel.

6. A computer program product as recited in claim 5, wherein the method further comprises subtracting a direct current offset from at least one of the inphase or quadrature components of either the first or second channel.

7. A computer program product as recited in claim 1, wherein the method further comprises adjusting a cutoff frequency used in at least one of the acts of filtering the first intermediate frequency, filtering the second intermediate frequency, and filtering the combined first intermediate frequency and second intermediate frequency, based at least in part on a symbol rate.

8. A computer program product as recited in claim 1, wherein the method further comprises setting the first and second intermediate frequencies based on a frequency synthesizer control module.

9. A computer program product as recited in claim 1, wherein the method further comprises:
receiving a wideband input signal that includes the first channel and the second channel;
amplifying the received wideband input signal; and
filtering the amplified wideband input signal to remove signals outside of a desired range of channel frequencies.

10. A computer program product as recited in claim 1, wherein at least one of the plurality of channels lies within a frequency range of 900 MHz to 2200 MHz.

11. A computer program product as recited in claim 1, wherein the first channel includes video data and wherein the second channel includes broadcast data other than video data.

12. A computer program product comprising one or more computer-readable storage media storing computer-executable instructions that when executed implement a method of combining at least two channels, selected from a plurality of channels received at a system, into one subchannel such that certain signal processing may be performed on the one subchannel, wherein the certain signal processing of the one subchannel requires fewer of certain components than would be required to process the at least two channels separately, wherein the method comprises:
simultaneously tuning to a first channel and a second channel, wherein the first and second channels are received in one or more signals, the one or more signals, when received, including one or more additional channels between the first and second channels;
down converting the first channel to a first intermediate frequency;
down converting the second channel to a second intermediate frequency, wherein the second intermediate frequency is relatively higher than the first intermediate frequency;
after down converting the first channel, removing all signals above the first channel from the first intermediate frequency;
after down converting the second channel, removing all signals below the second channel from the second intermediate frequency;
after removing signals from the first and second intermediate frequencies, combining the first intermediate frequency and the second intermediate frequency such that the first channel and the second channel are adjacent to each other and have no intervening channels therebetween, such that all of the one or more additional channels that were between the first channel and the second channel when the one or more signals were received are absent after combining the first and second intermediate frequencies; and
removing signals below the first channel and above the second channel, such that a resulting multiple channel intermediate frequency signal contains only the adjacent first and second channels.

13. A computer program product as recited in claim 12, wherein the method further comprises increasing the strength of the resulting multiple channel intermediate frequency signal in accordance with an automatic gain control signal.

14. A computer program product as recited in claim 13, wherein the method simultaneously combines at least eight channels into four separate subchannels, and wherein the method is practiced within a single integrated circuit.

15. A computer program product as recited in claim 13, wherein the method further comprises:
producing a digital representation of the resulting multiple channel intermediate frequency signal, wherein the automatic gain control signal is based at least in part on an appropriate input signal level for producing the digital representation;
down converting the digital representation of the multiple channel intermediate frequency signal to position each of the adjacent first and second channels at baseband;
separating the inphase and quadrature components of the first and second channels; and
removing signals other than a desired inphase or quadrature component from each channel.

16. A computer program product as recited in claim 15, wherein the method further comprises removing a direct current offset from at least one of the inphase or quadrature components of either the first or second channel.

17. A computer program product as recited in claim 12, wherein the method further comprises varying a cutoff frequency used in at least one of the steps for removing signals, based at least in part on a symbol rate.

18. A computer program product as recited in claim 12, wherein at least one of the plurality of channels lies within a frequency range of 900 MHz to 2200 MHz.

19. A computer program product as recited in claim 12, wherein the second channel is dedicated to monitoring a particular one of the plurality of channels, and wherein the second channel includes broadcast data other than video data.

20. A tuner comprising computer hardware and computer-readable storage media storing computer-executable instructions, wherein the computer hardware and computer-executable instructions collectively implement a method of combining at least two channels, selected from a plurality of channels received at the tuner, into one subchannel such that certain signal processing may be performed on the one subchannel, wherein the certain signal processing of the one subchannel requires fewer of certain components than would be required to process the at least two channels separately, wherein the method comprises:
receiving at an RF switch of the tuner a satellite television signal from three separate satellites, the three separate satellites providing a plurality of channels, wherein the plurality of channels have a frequency range between about 900 MHz and about 2200 MHz, and includes ninety-six channels distributed with thirty-two channels on each of the three separate channels and wherein receiving the satellite television signal includes simultaneously processing two channels included within the plurality of channels within the satellite television signal, the simultaneously processed two channels being separated within the satellite television signal by one or more additional channels positioned between the first and second channels;
internally matching an analog ASIC of the tuner to a resistance of seventy-five ohms, and setting the RF switch for either normal or loop-through operation, as controlled by a frequency synthesizer of the tuner;
compensating for insertion loss of RF components in analog processing, wherein compensating for the insertion loss comprises using a wide-band low noise amplifier and amplifying an output signal of the RF switch such that a signal gain of at least twenty-five dB is obtained over an entire operating frequency range of about 925 MHz to 2050 MHz with a noise figure of less than about one and a half dB, wherein an input and output voltage standing wave ratio is less than two-to-one for the wide-band low noise amplifier;

rejecting unwanted out of band spurious and image frequency components, wherein rejecting includes using a wide-band pass filter of the tuner, which wide-band pass filter includes a three dB pass-band with a width between 1000 MHz and 1200 MHz, and centered between about 1400 MHz and 1650 MHz;

mixing an output of the wide-band pass filter with eight local oscillator frequencies generated by eight independent frequency synthesizers each having a phase lock loop design referenced to a crystal oscillator that is separate from an analog ASIC, and locked to an input reference frequency and scaled by a factor;

positioning channels at different frequencies by using a plurality of mixers, the plurality of mixers producing eight independent desired channels with channel center frequencies positioned on two different intermediate frequencies, namely a first channel being down converted and positioned with at least one of the plurality of mixers and at a first intermediate frequency (IF), relatively lower than a second intermediate frequency (IF), and positioned and down converted with another of the plurality of mixers a second channel at the second intermediate frequency (IF), relatively higher than the first intermediate frequency (IF), wherein the first IF and second IF remain wide-band signals following positioning and down converting by the plurality of mixers;

using at least one variable low pass filter connected to at least one of the plurality of mixers to receive the first IF and to remove all signals above the first channel, wherein the at least one variable low pass filter has steep roll-off and a configurable cut-off frequency;

using at least one variable high pass filter connected to at least one of the plurality of mixers to receive the second IF and to remove all signals below the second channel, wherein the at least one variable high pass filter has steep roll-off and a configurable cut-off frequency;

using a power summer connected to the low and high pass filters, receiving and combining the first filtered IF and second filtered IF, such that the first channel and the second channel, when combined, are adjacent to each other and lack any intervening channels therebetween, such that the one or more additional channels that were between the first and second channels when the satellite television signal was received are absent from the combined signal produced by the power summer;

using a band pass filter connected to the power summer, receiving the combined first and second filtered IFs and removing signals below the first channel and above the second channel, and such that a resulting multiple channel IF signal contains only the adjacent first and second channels; and using a second stage amplifier connected to the band pass filter, receiving the resulting multiple channel IF signal, wherein a gain of the amplifier is controlled by an automatic gain control signal that includes a digital ASIC working with a micro-controller.

* * * * *

UNITED STATES PATENT AND TRADEMARK OFFICE
CERTIFICATE OF CORRECTION

| | | |
|---|---|---|
| PATENT NO. | : 7,664,203 B2 | Page 1 of 1 |
| APPLICATION NO. | : 11/058076 | |
| DATED | : February 16, 2010 | |
| INVENTOR(S) | : Dan Q. Tu et al. | |

It is certified that error appears in the above-identified patent and that said Letters Patent is hereby corrected as shown below:

In column 24, line 3, in Claim 20, delete "cut- off" and insert -- cut-off --, therefor.

Signed and Sealed this
Eighth Day of February, 2011

David J. Kappos
*Director of the United States Patent and Trademark Office*